(12) United States Patent
Nakamura et al.

(10) Patent No.: US 7,470,390 B2
(45) Date of Patent: Dec. 30, 2008

(54) PRODUCTION METHOD OF POLYCRYSTALLINE CERAMIC BODY

(75) Inventors: Masaya Nakamura, Nagoya (JP); Toshiatsu Nagaya, Kuwana (JP); Tatsuhiko Nonoyama, Chiryu (JP); Hisaaki Takao, Aichi (JP); Yasuyoshi Saito, Aichi (JP); Takahiko Homma, Aichi (JP); Kazumasa Takatori, Aichi (JP)

(73) Assignee: Denso Corporation, Kariya (JP)

( * ) Notice: Subject to any disclaimer, the term of this patent is extended or adjusted under 35 U.S.C. 154(b) by 442 days.

(21) Appl. No.: 11/258,356

(22) Filed: Oct. 25, 2005

(65) Prior Publication Data

US 2006/0091588 A1 May 4, 2006

(30) Foreign Application Priority Data

Oct. 29, 2004 (JP) ............................ 2004-316636
Jul. 6, 2005 (JP) ............................ 2005-197668

(51) Int. Cl.
C04B 35/64 (2006.01)
C04B 33/32 (2006.01)
C04B 35/622 (2006.01)

(52) U.S. Cl. ...................................... 264/672; 264/653
(58) Field of Classification Search ................. 264/672, 264/653
See application file for complete search history.

(56) References Cited

U.S. PATENT DOCUMENTS

| | | | | |
|---|---|---|---|---|
| 4,192,840 A | * | 3/1980 | Schmelz et al. | ............. 264/620 |
| 5,039,637 A | * | 8/1991 | Hyuga et al. | ................. 501/135 |
| 6,387,295 B1 | | 5/2002 | Saito | |
| 6,576,182 B1 | * | 6/2003 | Ravagni et al. | ............. 264/628 |
| 6,692,652 B2 | * | 2/2004 | Takao et al. | ............. 252/62.9 R |
| 6,864,621 B2 | | 3/2005 | Ogawa et al. | |
| 6,884,364 B2 | * | 4/2005 | Sato et al. | ............... 252/62.9 R |
| 6,978,901 B1 | * | 12/2005 | Adler et al. | .................. 210/506 |
| 2003/0178605 A1 | | 9/2003 | Nonoyama et al. | |
| 2003/0178606 A1 | | 9/2003 | Nonoyama et al. | |
| 2005/0006618 A1 | | 1/2005 | Nanao et al. | |

FOREIGN PATENT DOCUMENTS

| | | |
|---|---|---|
| JP | 2000-313664 | 11/2000 |
| JP | 2003-300776 | 10/2003 |
| JP | 2003-306479 | 10/2003 |
| JP | 2003-327472 | 11/2003 |
| JP | 2003-342069 | 12/2003 |
| JP | 2003-342071 | 12/2003 |
| JP | 2004-007406 | 1/2004 |

* cited by examiner

*Primary Examiner*—Steven P Griffin
*Assistant Examiner*—Cynthia Szewczyk
(74) *Attorney, Agent, or Firm*—Harness, Dickey & Pierce, PLC

(57) ABSTRACT

To provide a production method of a polycrystalline ceramic body with excellent density, a preparation step, a mixing step, a forming step and a heat-treating step are performed. In the preparation step, a coarse particle ceramic powder, and a fine particle powder having an average particle diameter of ⅓ or less of the average particle diameter of the coarse particle ceramic powder are prepared. In the mixing step, the coarse particle ceramic powder and the fine particle powder are mixed to produce a raw material mixture. In the forming step, the raw material mixture is formed to a shaped body. In the heat-treating step, the shaped body is heated and thereby sintered to produce a polycrystalline ceramic body. In the heat-treating step, a temperature elevating process and a first holding process are performed and at the same time, a second holding process and/or a cooling process are performed. In the temperature elevating process, heating is started to elevate the temperature and in the first holding process, the shaped body is held at a temperature T1° C. In the second holding process, the shaped body is held at a temperature T2° C. lower than the temperature T1° C. In the cooling process, the shaped body is cooled at a temperature dropping rate of 60° C./h or less from the temperature T1° C.

14 Claims, 2 Drawing Sheets

PRODUCTION METHOD OF POLYCRYSTALLINE CERAMIC BODY

TECHNICAL FIELD

The present invention relates to a production method of a polycrystalline ceramic body.

BACKGROUND ART

A polycrystalline body comprising a ceramic (a polycrystalline ceramic body) is used, for example, in sensors for temperature, heat, gas, ions and the like, electron circuit parts such as capacitors, resistors and integrated circuit boards, and optical or magnetic recording elements. In particular, a polycrystalline ceramic body having a piezoelectric effect (hereinafter referred to as a "piezoelectric ceramic") is being widely used in the field of electronics or mechatronics because of its high performance, high degree of freedom in shape and relatively easy material design.

The piezoelectric ceramic is obtained by subjecting a ferroelectric ceramic to a so-called polarizing process of applying an electric field to align the direction of polarization of the ferroelectric material to a fixed direction. In order to align spontaneous polarization to a fixed direction, by a polarizing process, in the piezoelectric ceramic, an isotropic perovskite-type crystal structure capable of spontaneously polarizing in three-dimensional direction is advantageous. Therefore, most piezoelectric ceramics in practical use are isotropic perovskite-type ferroelectric ceramics.

Known examples of isotropic perovskite-type ferroelectric ceramics include $Pb(Zr,Ti)O_3$ (hereinafter referred to as "PZT"), a PZT ternary system obtained by adding a lead-based composite perovskite to PZT, $BaTiO_3$ and $Bi_{0.5}Na_{0.5}TiO_3$ (hereinafter referred to as "BNT").

Among these, the lead-based piezoelectric ceramic as represented by PZT has good piezoelectric properties as compared with other piezoelectric ceramics and predominates in the piezoelectric ceramics practically used at present. However, this piezoelectric ceramic contains lead oxide (PbO) having a high vapor pressure and disadvantageously imposes a large load on the environment. Therefore, a low-lead or lead-free piezoelectric ceramic having piezoelectric properties equivalent to those of PZT is in demand.

On the other hand, a $BaTiO_3$ ceramic has relatively high piezoelectric properties among lead-free piezoelectric materials and is being utilized in sonar systems and the like. Also, some solid solutions of $BaTiO_3$ and another non-lead type perovskite compound (for example, BNT) show relatively good piezoelectric properties. However, these lead-free piezoelectric ceramics have a problem that the piezoelectric properties are inferior to those of PZT.

In order to solve such problems, various piezoelectric ceramics have been heretofore proposed.

For example, a piezoelectric ceramic comprising an isotropic perovskite-type potassium sodium niobate exhibiting relatively good piezoelectric properties, of non-lead materials, or a solid solution thereof, is known (see, Japanese Unexamined Patent Publication (Kokai) Nos. 2000-313664, 2003-300776, 2003-306479, 2003-327472, 2003-342069 and 2003-342071).

However, these lead-free piezoelectric ceramics have a problem that the piezoelectric properties are not yet satisfactory as compared with the PZT-type piezoelectric ceramic.

Under these circumstances, a piezoelectric element comprising a piezoelectric ceramic containing ceramic-crystal grains having shape anisotropy and a spontaneous polarization preferentially oriented in one plane is disclosed (see, Japanese Unexamined Patent Publication (Kokai) No. 2004-7406).

It is generally known that the piezoelectric properties, and the like, of the isotropic perovskite-type compound vary depending on the direction of crystal axis. Therefore, if the crystal axis giving good piezoelectric properties or the like can be oriented to a fixed direction, the anisotropy of piezoelectric properties can be maximally utilized and an enhancement in the performance of the piezoelectric ceramic can be expected. As disclosed in Japanese Unexamined Patent Publication (Kokai) No. 2004-7406 supra, according to a method of using, as a reactive template, a plate-like powder having a predetermined composition, and sintering the plate-like powder and a raw material powder, thereby orienting a specific crystal plane, a high-performance crystal-oriented ceramic in which a specific crystal plane has a high degree of orientation can be produced.

However, in the case of producing a polycrystalline ceramic body (crystal-oriented ceramic) by sintering a plate-like powder and a raw material powder as described above, a dense polycrystalline ceramic body is disadvantageously not obtained, because the plate-like powder and the raw material powder, which are different in the particle size, are sintered. Particularly, when a non-lead type material is used, there is a problem that voids are readily generated and densification scarcely occurs.

The polycrystalline ceramic body in which voids are generated is disadvantageous in that the piezoelectric properties such as the piezoelectric $d_{31}$ constant, and the dielectric properties such as the dielectric loss, are deteriorated. Furthermore, there is a problem that the strength decreases and the polycrystalline ceramic body is readily fractured due to fatigue or the like in the course of use.

Generally, in the sintering of a ceramic, as the particle diameter of the powder particle used for the raw material becomes smaller, the specific surface becomes larger and the activity becomes higher, so that the sintering can be performed at a lower temperature as compared with the particle having a large particle diameter. Also, as the uniformity of the particle diameter of the raw material powder becomes higher, the sinterability becomes better and densification tends to be more easily attained.

As in the above-described technique for enhancing the crystal orientation of a ceramic, when a raw material powder prepared by blending a coarse template particle for accelerating the crystal orientation and a fine particle comprising a complementary substance for obtaining the objective ceramic is sintered, the sintering rate becomes non-uniform in the firing process due to a difference, in sinterability, between the fine particle and the coarse template particle.

For example, when the raw material powder is fired in the temperature region where sintering of the fine particle is accelerated, sintering of the coarse template particle with the fine particle can hardly proceed even though sintering of the fine particle is accelerated. Therefore, voids are formed in the periphery of the template particle and a dense sintered body may not be obtained. More specifically, in this case, a sintered body having a low open porosity may be obtained due to acceleration of sintering of the fine particle, but sintering of the template particle with the fine particle present in the periphery of the template particle is retarded and closed pores (voids) may remain in the sintered body. As a result, the sintered body obtained is decreased in the bulk density.

On the other hand, when firing is performed at a temperature higher than the temperature suitable for sintering, particle growth is accelerated rather than the sintering and this allows for occurrence of particle growth among fine particles and occurrence of sintering between the fine particle and the template particle and particle growth. Under this temperature condition, firm bonding is formed among the raw material powder particles such as fine powder and template powder, but the progress of sintering is retarded. As a result, the sintered body obtained may have increased open porosity.

Such a problem arises not only in the case of producing a polycrystalline ceramic body comprising a crystal-oriented ceramic but also in many other cases of producing a polycrystalline ceramic body.

That is, in the case of producing a polycrystalline ceramic body by mixing and sintering raw material powders differing in the particle diameter, there is a problem that densification can hardly occur.

The present invention has been made by taking account of these conventional problems and an object of the present invention is to provide a production method of a polycrystalline ceramic body with excellent density.

DISCLOSURE OF THE INVENTION

The present invention is a method for producing a polycrystalline ceramic body, comprising:

a preparation step of preparing a coarse particle ceramic powder having an average particle diameter of 1 to 20 μm, and a fine particle powder having an average particle diameter of ⅓ or less of the average particle diameter of the coarse particle ceramic powder and producing the polycrystalline ceramic body when sintered with the coarse particle ceramic powder, a mixing step of mixing the coarse particle ceramic powder and the fine particle powder to produce a raw material mixture, a forming step of forming the raw material mixture to produce a shaped body (a powder compact), and a heat-treating step of heating the shaped body, thereby shrinking the shaped body and at the same time, sintering the coarse particle ceramic powder and fine particle powder to produce the polycrystalline ceramic body, wherein, in the heat-treating step, a temperature elevating process of starting heating the shaped body to elevate the temperature and a first holding process of holding the shaped body at a temperature T1° C. where 600≦T1≦1,500, for 0.1 minute or more are performed and at the same time, a second holding process of holding the shaped body at a temperature T2° C. where T2≧300, lower than the temperature T1° C. for 10 minutes or more, which is a process successive to the first holding process, and/or a cooling process of cooling the shaped body at a temperature dropping rate of 60° C./h or less from the temperature T1° C., which is a process successive to the first holding process, are performed (claim 1).

In the production method of the present invention, the preparation step, the mixing step, the forming step and the heat-treating step are performed.

In the preparation step, a coarse particle ceramic powder having an average particle diameter of 1 to 20 μm, and a fine particle powder having an average particle diameter of ⅓ or less of the average particle diameter of the coarse particle ceramic powder and producing the polycrystalline ceramic body when sintered with the coarse particle ceramic powder, are prepared. Subsequently, in the mixing step, the coarse particle ceramic powder and the fine particle powder are mixed to produce a raw material mixture. Furthermore, in the forming step, the raw material mixture is formed to produce a shaped body. Thereafter, in the heat-treating step, the shaped body is heated, thereby shrinking the shaped body and at the same time, sintering the coarse particle ceramic powder and fine particle powder to produce the polycrystalline ceramic body.

In this way, in the present invention, a polycrystalline ceramic body can be produced by heating the shaped body and thereby sintering the coarse particle ceramic powder and the fine particle powder.

In the heat-treating step, particularly, the temperature elevating process and the first holding process are performed as well as the second holding process and/or the cooling process are performed. More specifically, in the heat-treating step, the temperature elevating process and the first holding process are performed and furthermore, either one step of the second holding process and the cooling process or both steps of the second holding process and the cooling process is (are) performed.

In the temperature elevating process, by starting heating the shaped body to elevate the temperature, sintering of the shaped body can be started. In the first holding process, the shaped body is held at a temperature T1° C. (provided that 600≦T1≦1,500) for 0.1 minute or more. In the second holding process, the shaped body is held at a temperature T2° C. (provided that T2≧300) lower than the temperature T1° C. for 10 minutes or more. In the cooling process, the shaped body is cooled at a temperature dropping rate of 60° C./h or less from the temperature T1° C.

In this way, in the temperature elevating process and the first holding process, sintering of the shaped body is started and at the same time, particle growth is satisfactorily accelerated at a maximum temperature T1° C., whereby bonding among fine particles and bonding between the coarse particle and the fine particle can be made firm. Furthermore, in the second holding step and/or the cooling step, remaining voids can be eliminated by keeping in the temperature region where sintering proceeds.

At the heating in the first holding process, the open porosity is liable to increase, that is, closed pores are not produced but many continuous pores communicating with the outside of the sintered body are readily produced. Accordingly, in the present invention, the second holding process of heating the shaped body at a temperature lower than the heating temperature T1° C. in the first holding process and/or a cooling process of cooling the shaped body at a temperature dropping rate of 60° C./h or less are performed, whereby sintering can be caused to proceed at a lower temperature and the pores can be eliminated through the progress of sintering.

In this way, voids can be decreased and a polycrystalline ceramic body having excellent density can be produced.

As described above, according to the present invention, a production method of a polycrystalline ceramic body with excellent denseness can be provided.

DETAILED DESCRIPTION OF THE INVENTION

Figure 4:
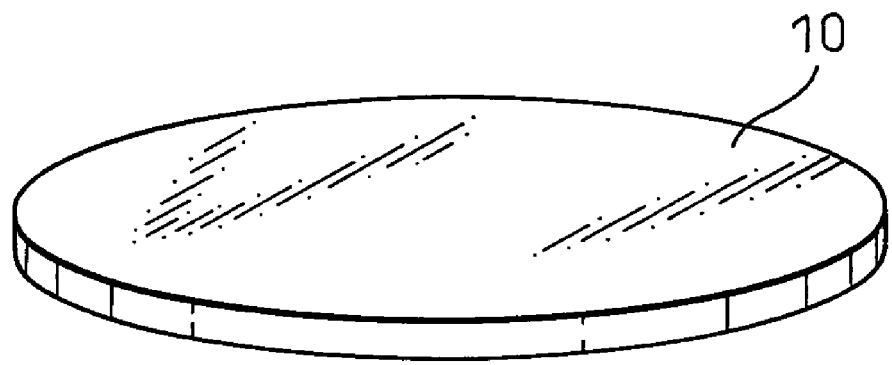
FIG. 4 illustrates a polycrystalline ceramic body produced by the method of the present disclosure.

FIG. 4 illustrates a polycrystalline ceramic body 10 which is manufactured using the method in accordance with the present disclosure. While FIG. 4 illustrates polycrystalline ceramic body 10. it is within the scope of the present disclosure to manufacture other polycrystalline ceramic bodies using the method of the present disclosure. The embodiment of the present invention is described below.

In the production method of the present invention, the above-described preparation step, mixing step, forming step and heat-treating step are performed.

In the preparation step, the coarse particle ceramic powder and the fine particle powder are prepared.

The coarse particle ceramic powder comprises a ceramic and has an average particle diameter of 1 to 20 μm.

The ceramic constituting the coarse particle ceramic powder can be appropriately selected so that a polycrystalline ceramic body comprising a desired ceramic can be obtained.

If the average particle diameter of the coarse particle ceramic powder is less than 1 μm, the effect of enhancing the denseness of a polycrystalline ceramic body by the present invention may not be fully brought out, whereas if it exceeds 20 μm, the sinterability seriously decreases and a polycrystalline ceramic body having a high sintered body density may not be obtained after the sintering step. The average particle diameter of the coarse particle ceramic powder is preferably from 1 to 13 μm, more preferably from 2 to 8 μm.

The coarse particle ceramic powder may have an anisotropic shape. In this case, as described later, the anisotropically shaped coarse particle ceramic powder (hereinafter sometimes referred to as an "anisotropically shaped powder") with a specific crystal plane being oriented is oriented in the forming step and subsequently, the coarse particle ceramic powder as a template is sintered together with the fine particle powder in the heat-treating step, whereby a polycrystalline ceramic body comprising a crystal-oriented ceramic, in which a specific plane of a crystal grain constituting the polycrystalline ceramic body is oriented, can be produced.

The "anisotropic shape" as used herein means that the dimension in the longitudinal direction is large as compared with the dimension in the width or thickness direction. Specific preferred examples thereof include shapes such as plate, column, flake and needle.

The coarse particle ceramic powder preferably has an anisotropic shape with an average aspect ratio of 3 to 100 (claim 8).

If the average aspect ratio of the coarse particle ceramic powder is less than 3, at the time of producing a polycrystalline ceramic body comprising a crystal-oriented ceramic described later by using the coarse particle ceramic powder, the coarse particle ceramic powder can be hardly oriented in one direction and a polycrystalline ceramic body comprising a desired crystal-oriented ceramic may not be obtained. On the other hand, if the average aspect ratio exceeds 100, the strength of the coarse particle ceramic powder is extremely decreased and the coarse particle ceramic powder may be fractured in the forming step. In the case of obtaining a polycrystalline ceramic body comprising a crystal-oriented ceramic having a high orientation degree, the aspect ratio of the coarse particle ceramic powder is preferably 5 or more, more preferably 10 or more. The average aspect ratio is an average value of maximum dimension/minimum dimension of the coarse particle ceramic powder.

The fine particle powder has an average particle diameter of ⅓ or less of the average particle diameter of the coarse particle diameter. The average particle diameter of the fine particle powder is preferably ⅕ or less, more preferably ¹⁄₁₀ or less, of the average particle diameter of the coarse particle diameter. In this case, the operational effect of the present invention, that a polycrystalline ceramic body with excellent density is obtained, can be remarkably brought out. Also, the average particle diameter of the fine particle powder is preferably 4 μm or less. In this case, a polycrystalline ceramic body having more excellent formability can be obtained. The average particle diameter of the fine particle powder is more preferably 2 μm or less, still more preferably 1 μm or less.

The fine particle powder may be, for example, a ceramic powder producing the polycrystalline ceramic body when sintered with the coarse particle ceramic powder. The fine particle powder may have the same composition as the ceramic of the coarse particle ceramic powder or may have a different composition.

The species of the ceramics for the coarse particle ceramic powder and the fine particle powder may be appropriately selected according to the composition of the desired polycrystalline ceramic body.

Subsequently, in the mixing step, the coarse particle ceramic powder and the fine particle powder are mixed to produce a raw material mixture.

It the mixing step, the coarse particle ceramic powder and the fine particle powder are preferably mixed such that the blending ratio of the coarse particle ceramic powder is from 0.01 to 70 parts by weight per 100 parts by weight of the total amount of the coarse particle ceramic powder and the fine particle powder (claim 2).

If the blending ratio of the coarse particle ceramic powder is less than 0.01 part by weight, for example, at the time of producing a polycrystalline ceramic body comprising a crystal-oriented ceramic, the orientation degree of the crystal-oriented ceramic may be decreased, whereas if it exceeds 70 parts by weight, the sinterability seriously decreases and a polycrystalline ceramic body having a high sintered body density may not be obtained after the heat-treating step. The blending ratio of the coarse particle ceramic powder is preferably from 0.1 to 50 parts by weight, more preferably from 1 to 10 parts by weight.

In the forming step, the raw material mixture is formed to produce a shaped body (a powder compact). Thereafter, in the heat-treating step, the temperature elevating process and the first holding process are performed as well as the second holding process and/or the cooling process are performed, whereby the shaped body (a powder compact) is heated to cause shrinking of the shaped body and at the same time, sintering of the coarse particle ceramic powder and fine particle powder, as a result, the polycrystalline ceramic body is produced.

In the temperature elevating process, the temperature is elevated by starting heating the shaped body (a powder compact).

In the temperature elevating process, the temperature elevating rate is preferably controlled such that the shrinkage of the shaped body (powder compact), due to heating, takes place at a linear shrinkage rate of 25%/h or less (claim 6).

If the linear shrinkage rate exceeds 25%/h, voids are readily generated in the shaped body during the temperature elevating process. The linear shrinkage rate is preferably 10%/h or less, more preferably 5%/h or less, still more preferably 2%/h or less. Also, from the standpoint of enhancing the productivity, the linear shrinkage rate is preferably 0.1%/h or more.

The linear shrinkage rate can be measured, for example, by a thermal mechanical analyzer (TMA).

In the temperature elevating process, the temperature elevating rate is preferably controlled such that the shrinkage of the shaped body due to heating takes place at a nearly constant linear shrinkage rate (hereinafter sometimes referred to as "a constant-rate shrinkage factor is obtained") in the temperature region from temperature (T1−50)° C. to T1° C. (claim 7).

As for the nearly constant linear shrinkage rate, assuming that in the temperature range from (T1−50)° C. to T1° C., the maximum linear shrinkage is A and the minimum linear shrinkage rate is B, B/A is preferably 0.6 or more, more preferably 0.8 or more, still more preferably 0.9 or more.

In this case, the shaped body is prevented from abrupt volumetric shrinkage in the temperature elevating process and sintering of the fine particles with each other proceeds before firm bonding is formed between the fine particle and the coarse particle, so that generation of voids can be inhibited.

Subsequently, in the first holding process, the shaped body is held at a temperature T1° C. (provided that $600 \leq T1 \leq 1,500$) for 0.1 minute or more.

If T1 is less than 600 or the holding time at a temperature T1° C. is less than 0.1 minute, firing of the shaped body does not satisfactorily proceed and a dense polycrystalline ceramic body may not be obtained, whereas if T1 exceeds 1,500, the open porosity increases and, in this case, a dense polycrystalline ceramic body may not be obtained.

The holding temperature T1 (° C.) in the first holding process is preferably $1,000 \leq T1 \leq 1,300$ (claim 3).

Also, the holding time at a temperature T1° C. is preferably 30 minutes or more, more preferably 60 minutes or more. Furthermore, from the standpoint of preventing increase of the open porosity, the upper limit of the holding time at a temperature T1° C. is preferably 2,000 minutes or less, more preferably 600 minutes or less, still more preferably 300 minutes or less.

The temperature T1° C. and the holding time at the temperature T1° C. in the first holding process are preferably determined by the temperature T1 and the holding time where when the forming body is fired only at a temperature T1° C., the open porosity becomes 10% or less, more preferably by the temperature T1° C. and the holding time where the open porosity becomes 5% or less, still more preferably 3% or less.

The open porosity can be calculated as follows.

First, the volume of open pores present in the polycrystalline ceramic body is calculated from the difference between the dry weight of the polycrystalline ceramic body obtained after the heat-treating step and the weight when water is impregnated into the open pore part. Then, the volume of the polycrystalline ceramic body excluding the calculated volume of the open pore part is measured by the Archimedes method.

The open porosity can be calculated by dividing the volume of open pores by the entire volume (the total of the volume of open pores and the volume of the polycrystalline ceramic body in the portion excluding open pores) of the polycrystalline ceramic body and multiplying the obtained value by 100.

After the first holding process, the second holding process and/or the cooling process are performed.

In the second holding process, the shaped body is held at a temperature T2° C. (provided that $T2 \geq 300$), lower than the temperature T1° C., for 10 minutes or more.

If T2<300, sintering of the shaped body may not satisfactorily proceed or voids generated in the first holding process may not be satisfactorily decreased. The temperature T2 is preferably $T2 \geq 600$.

If the holding time at T2 is less than 10 minutes, voids generated in the first holding process may not be satisfactorily decreased. Also, the upper limit of the holding time at a temperature T2 is preferably 2,000 minutes or less, otherwise the productivity of the polycrystalline ceramic body may decrease.

The temperature T2° C. and the holding time at the temperature T2° C. in the second holding process are preferably determined by the temperature T2° C. and the holding time where when the forming body is fired only at a temperature T2° C., the open porosity becomes 3% or less, more preferably by the temperature T2° C. and the holding time where the open porosity becomes 2% or less, still more preferably 1% or less.

The holding temperature T1 (° C.) in the first holding process and the holding temperature T2 (° C.) in the second holding process preferably satisfy the relationship of $5 \leq (T1-T2) \leq 300$ (claim 4).

If (T1−T2)<5, voids in the shaped body may not be satisfactorily decreased, whereas if (T1−T2)>300, firing of the shaped body may not satisfactorily proceed. In either case, the obtained polycrystalline ceramic body may not be satisfactory in density.

In the cooling process, the shaped body is cooled at a temperature dropping rate of 60° C./h or less from the temperature T1° C. If the temperature dropping rate exceeds 60° C./h, voids generated in the first holding process may not be satisfactorily decreased.

The temperature dropping rate in the cooling process is preferably 40° C./h or less (claim 5), more preferably 20° C./h or less, still more preferably 10° C./h or less, yet still more preferably 5° C./h or less. Also, the temperature dropping rate is preferably 1° C./h or more, otherwise the productivity of the polycrystalline ceramic body may decrease.

In the cooling process, the cooling may be performed to room temperature, but in order to shorten the entire process time, the cooling process can be performed only in the temperature region where sintering is accelerated. In this case, the cooling process is preferably performed to a temperature of (T1−500)° C., more preferably (T1−300)° C., still more preferably (T1−100)° C.

In the production method of the present invention, a polycrystalline ceramic body can be produced by performing the above-described multiple steps.

In the present invention, a polycrystalline ceramic body having various compositions, crystal structures or the like can be produced by appropriately selecting the coarse particle ceramic powder and the fine particle powder prepared in the preparation step.

The polycrystalline ceramic body preferably comprises an isotropic perovskite-type compound as the main phase (claim 13).

In this case, a polycrystalline ceramic body not containing lead but, nevertheless, having excellent piezoelectric properties (e.g., piezoelectric $d_{31}$ constant, electromechanical coupling factor Kp, piezoelectric $g_{31}$ constant) and dielectric properties (e.g., relative dielectric constant $\epsilon_{33T}/\epsilon_0$, dielectric loss tan δ) can be produced.

Also, the polycrystalline ceramic body preferably comprises a crystal-oriented ceramic in which a specific crystal plane A of each crystal grain is oriented (claim 9).

In this case, a polycrystalline ceramic body more excellent in the piezoelectric properties, dielectric properties and the like can be produced.

Examples of such a crystal-oriented ceramic include those comprising, as the main phase, an isotropic perovskite-type compound represented by formula (1): $\{Li_x(K_{1-y}Na_y)_{1-x}\}(Nb_{1-z-w}Ta_zSb_w)O_3$ wherein $0 \leq x \leq 0.2$, $0 \leq y \leq 1$, $0 \leq z \leq 0.4$, $0 \leq w \leq 0.2$ and $x+z+w>0$.

The "a specific crystal plane A is oriented" means both a case where each crystal grain is aligned to cause specific crystal planes A of crystal-oriented ceramics comprising, for example, a compound represented by formula (1) to run parallel with each other (hereinafter, this state is referred to as "plane orientation"), and a case where each crystal grain is aligned to cause a specific crystal plane A to run parallel with one axis penetrating the polycrystalline ceramic body (hereinafter, this state is referred to as "axis orientation").

The species of the oriented crystal plane A can be selected, for example, according to the direction of spontaneous polarization of the crystal-oriented ceramic comprising a compound represented by formula (1) or other compound, or the usage, required properties or the like of the crystal-oriented ceramic. That is, the crystal plane A can be selected from a pseudo-cubic {100} plane, a pseudo-cubic {110} plane, a pseudo-cubic {111} plane and the like according to the purpose.

The "pseudo-cubic {HKL}" means that although the crystal-oriented ceramic comprising an isotropic perovskite-type compound or the like generally takes a structure slightly distorted from a cubic crystal, such as tetragonal crystal, orthorhombic crystal or trigonal crystal, the distortion is slight and therefore, the structure is regarded as a cubic crystal and expressed by the Mirror index.

In the case where a specific crystal plane A is plane-oriented, the degree of plane orientation can be expressed by an average orientation degree F(HKL) according to the Lotgering's method represented by the following mathematical formula 1:

(Mathematical Formula 1)
$$F(HKL) = \frac{\frac{\sum' I(HKL)}{\sum I(hkl)} - \frac{\sum' I_0(HKL)}{\sum I_0(hkl)}}{1 - \frac{\sum' I_0(HKL)}{\sum I_0(hkl)}} \times 100 (\%)$$

In mathematical formula 1, $\Sigma I(hkl)$ is a sum total of X-ray diffraction intensities of all crystal planes (hkl) measured for the crystal-oriented ceramic, $\Sigma I_0(hkl)$ is a sum total of X-ray diffraction intensities of all crystal planes (hkl) measured for a non-oriented ceramic having the same composition as the crystal-oriented ceramic, $\Sigma' I(HKL)$ is a sum total of X-ray diffraction intensities of crystallographically equivalent specific crystal planes (HKL) measured for the crystal-oriented ceramic, and $\Sigma' I_0(HKL)$ is a sum total of X-ray diffraction intensities of crystallographically equivalent specific crystal planes (HKL) measured for a non-oriented ceramic having the same composition as the crystal-oriented ceramic.

Accordingly, when each crystal grain constituting the polycrystalline ceramic body is non-oriented, the average orientation degree F(HKL) becomes 0%, whereas when the (HKL) plane of all crystal grains constituting the polycrystalline ceramic body is oriented in parallel with the measurement plane, the average orientation degree F(HKL) becomes 100%.

In the crystal-oriented ceramic, as the ratio of oriented crystal grains is larger, better properties are obtained. For example, in the case of plane-orienting a specific crystal plane, the average orientation degree F(HKL) as measured according to the Lotgering's method represented by mathematical formula 1 is preferably 30% or more so as to obtain good piezoelectric properties or the like. The average orientation degree is more preferably 50% or more. The specific crystal plane to be oriented is preferably a plane perpendicular to the polarization axis. In the case where the crystal type is a tetragonal crystal as in the perovskite-type compound, the specific crystal plane A to be oriented is preferably a {100} plane.

It is preferred that in the polycrystalline ceramic body, a pseudo-cubic {100} plane according to the Lotgering's method is oriented as the crystal plane A and the orientation degree thereof is 30% or more (claim 10).

In the case of axis-orienting a specific crystal plane A, the orientation degree cannot be defined by the same orientation degree (mathematical formula 1) as the plane orientation, but the degree of axis orientation can be expressed by using an average orientation degree according to the Lotgering's method for (HKL) diffraction when X-ray diffraction is performed on the planes perpendicular to the orientation axis (hereinafter, referred to as an "axis orientation degree"). The axis orientation degree of a polycrystalline ceramic body where a specific crystal plane A is almost completely axis-oriented becomes nearly the same as the axis orientation degree measured for a polycrystalline ceramic body where a specific crystal plane is almost completely plane-oriented.

In the case where the polycrystalline ceramic body, comprising the above-described crystal-oriented ceramic, comprises, for example, a perovskite-type compound as the main phase, high piezoelectric properties and the like can be exhibited among those using a non-lead type piezoelectric ceramic. Furthermore, since a specific crystal plane of each crystal grain in the crystal-oriented ceramic is oriented in one direction, high piezoelectric properties and the like can be exhibited as compared with a non-oriented sintered body having the same composition.

More specifically, a polycrystalline ceramic body in which the piezoelectric $d_{31}$ constant at room temperature is 1.1 times or more that of a non-oriented sintered body having the same composition can be obtained by optimizing the composition, orientation degree, production conditions and the like of the crystal-oriented ceramic comprising, for example, a compound represented by formula (1). Also, in the obtained polycrystalline ceramic body, the piezoelectric $d_{31}$ constant at room temperature can be made to be 1.2 times or more that of a non-oriented sintered body having the same composition by more optimizing those conditions, or even to be 1.3 times or more by still better optimizing those conditions.

The polycrystalline ceramic body of a ceramic comprising an isotropic perovskite-type compound having a complicated composition, such as compound represented by formula (1), is usually produced by a method where simple compounds containing component elements are mixed to give an objective stoichiometric ratio, the resultant mixture is formed, temporarily fired and ground, and the ground powder is reformed and sintered. However, the crystal-oriented ceramic in which a specific crystal plane of each crystal grain is oriented in a specific direction can be hardly produced by such a method.

Accordingly, it is preferred that the coarse particle ceramic powder comprises a coarse particle having an oriented plane (orienting plane) formed by orientation of a specific crystal plane, the oriented plane (orienting plane) in the coarse particle has lattice matching with the specific crystal plane A constituting the polycrystalline ceramic body and in the forming step, forming is performed to align the oriented planes (orienting planes) of the coarse particles nearly in the same direction (claim 11).

In this case, a polycrystalline ceramic body comprising a crystal-oriented ceramic in which a specific crystal plane A is oriented as described above can be easily obtained.

More specifically, when a coarse particle ceramic powder (hereinafter sometimes referred to as a "first anisotropically shaped powder") comprising a coarse particle (hereinafter sometimes referred to as a "first oriented particle") having an oriented plane formed by orientation of a specific crystal plane, the oriented plane having lattice matching with the above-described specific crystal plane A constituting the polycrystalline ceramic body, is oriented in the forming step, the first anisotropically shaped powder becomes a template or a reactive template in the heat-treating step and the first anisotropically shaped powder and the fine particle powder are sintered or reacted and sintered, whereby a polycrystalline ceramic body comprising a crystal-oriented ceramic such as compound represented by formula (1) can be easily produced.

The lattice-matching property can be expressed by a lattice-matching ratio.

The lattice-matching property is described below by referring to, for example, a case where the first oriented particle is a metal oxide. When there is a correlation between, for example, a lattice point comprising an oxygen atom or a lattice point comprising a metal atom in the two-dimensional crystal lattice of the oriented plane of the first oriented particle and a lattice point comprising an oxygen atom or a lattice point comprising a metal atom in the two-dimensional crystal lattice of the specific crystal plane A oriented in the polycrystalline ceramic body, these two planes have lattice matching.

The lattice-matching ratio is a value obtained by dividing an absolute value of the difference between the lattice size of the oriented plane in the first oriented particle and the lattice size at a similar position of the specific crystal plane A oriented in the polycrystalline ceramic body, by the lattice size of the oriented plane in the first oriented-particle, and expressed in percentage.

The lattice size is a distance between lattice points in the two-dimensional crystal lattice of one crystal plane and can be measured by analyzing the crystal structure by means of X-ray diffraction, electron beam diffraction or the like. In general, as the lattice matching ratio is smaller, the first oriented particle has better lattice matching with the crystal plane A and can function as a better template.

In order to obtain a crystal-oriented ceramic having a high orientation degree, the lattice matching ratio of the first oriented particle is preferably 20% or less, more preferably 10% or less, still more preferably 5% or less.

The oriented plane is preferably a pseudo-cubic {100} plane (claim 12).

In this case, a polycrystalline ceramic body exhibiting excellent temperature dependency of displacement generated under a large electric field, in the tetragonal crystal region where the orientation axis and the polarization axis are agreeing, can be produced.

In the first oriented particle, the oriented plane is preferably a plane occupying a largest area in the first oriented plane.

In this case, the first oriented plane can be a better reactive template for the production of the polycrystalline ceramic body comprising a crystal-oriented ceramic.

The first oriented particle, that is, the coarse particle having an oriented plane formed by orientation of a specific crystal plane, the oriented plane having lattice matching with the specific crystal plane A constituting the polycrystalline ceramic body, is described below.

As for the first oriented particle, for example, those comprising a perovskite-type compound or the like can be used.

More specifically, those having the same composition as the ceramic of the objective polycrystalline ceramic body, such as isotropic perovskite-type compound represented by formula (1), can be used as the first oriented particle.

Also, the first oriented particle is not necessarily required to have the same composition as the ceramic of the objective polycrystalline ceramic body, such as compound represented by formula (1), and it may be sufficient if it produces a ceramic comprising the objective isotropic perovskite-type compound or the like when sintered with the fine particle powder in the heat-treating step. Accordingly, the first oriented particle can be selected from compounds, solid solutions and the like each containing one or more element out of the cation elements contained in the ceramic intended to produce such as isotropic perovskite-type compound.

As for the first oriented particle satisfying the above-described conditions, for example, those comprising a compound represented by the following formula (2) which is a kind of isotropic perovskite-type compound such as $NaNbO_3$ (hereinafter, referred to as "NN"), $KNbO_3$ (hereinafter, referred to as "KN") or $(K_{1-y}Na_y)NbO_3$ (0<y<1) or a compound resulting from replacement•solid dissolution of these compounds by a predetermined amount of Li, Ta and/or Sb, can be used.

(wherein x, y, z and w are $0 \leq x \leq 1$, $0 \leq y \leq 1$, $0 \leq z \leq 1$ and $1 \leq w \leq 1$).

The compound represented by formula (2) of course has good lattice matching with the isotropic perovskite-type compound represented by formula (1). Therefore, the first anisotropically shaped powder comprising the first oriented particle represented by formula (2) with the oriented plane being a plane having lattice matching with the crystal plane A in the polycrystalline ceramic body (hereinafter, this powder is particularly referred to as an "anisotropically shaped powder A") functions as a reactive template for the production of the crystal-oriented ceramic represented by formula (1). Furthermore, the anisotropically shaped powder A substantially consists of cation elements contained in the isotropic perovskite-type compound represented by formula (1) and therefore, when the anisotropically shaped powder A is used, a crystal-oriented ceramic remarkably reduced in impurity elements can be produced. Among these particles, a plate-like particle comprising the compound represented by formula (2) with the oriented plane being a pseudo-cubic {100} plane is preferred as the oriented particle. A plate-like particle comprising NN or KN with the oriented plane being a pseudo-cubic {100} plane is more preferred.

As for the first anisotropically shaped powder, for example, those comprising a layered perovskite-type compound, in which a crystal plane having a small surface energy has lattice matching with the crystal plane A of the polycrystalline ceramic body comprising a compound represented by formula (1) or the like, can be used. The layered perovskite-type compound has a large crystal lattice anisotropy and therefore, an anisotropically shaped powder comprising a layered perovskite-type compound with the oriented plane being a crystal plane having a small surface energy (hereinafter, this powder is particularly referred to as an "anisotropically shaped powder B") can be relatively easily synthesized.

A first example of the suitable layered perovskite-type compound constituting the anisotropically shaped powder B includes a bismuth layered perovskite-type compound represented by the following formula (3):

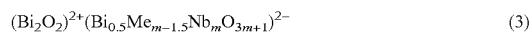

(wherein m is an integer of 2 or more, and Me is at least one member selected from Li, K and Na).

The compound represented by formula (3) is characterized in that the surface energy of the {001} plane is lower than the surface energy of other crystal planes, and therefore, the anisotropically shaped powder B with the oriented plane being a {001} plane can be easily synthesized by using the compound represented by formula (3). The "{001} plane" as used herein is a plane parallel to the $(Bi_2O_2)^{2+}$ layer of the bismuth layered perovskite-type compound. Moreover, the {001} plane of the compound represented by formula (3) has excellent lattice matching with the pseudo-cubic {100} plane of the isotropic perovskite-type compound represented by formula (1).

Therefore, the anisotropically shaped powder B comprising the compound represented by formula (3) and using the {001} plane as the oriented plane is suitable as a reactive template for the production of a crystal-oriented ceramic with the oriented plane being a pseudo-cubic {100} plane, that is, as the first anisotropically shaped powder.

Furthermore, when the compound represented by formula (3) is used and the composition of the fine particle powder described later is optimized, a crystal-oriented ceramic comprising the isotropic perovskite-type compound represented by formula (1) as the main phase can be produced so as to contain substantially no Bi as the A-site element.

A second example of the suitable layered perovskite-type compound constituting the anisotropically shaped powder B includes $Sr_2Nb_2O_7$. The {010} plane of $Sr_2Nb_2O_7$ has a surface energy lower than the surface energy of other crystal planes and has very excellent lattice matching with the pseudo-cubic {110} plane of the isotropic perovskite-type compound represented by formula (3). Therefore, a first anisotropically shaped powder comprising $Sr_2Nb_2O_7$ and using the {010} plane as the oriented plane is suitable as a reactive template for the production of a crystal-oriented ceramic with the oriented plane being a {110} plane.

A third example of the suitable layered perovskite-type compound constituting the anisotropically shaped powder B includes $Na_{1.5}Bi_{2.5}Nb_3O_{12}$, $Na_{2.5}Bi_{2.5}Nb_4O_{15}$, $Bi_3TiNbO_9$, $Bi_3TiTaO_9$, $K_{0.5}Bi_{2.5}Nb_2O_9$, $CaBi_2Nb_2O_9$, $SrBi_2Nb_2O_9$, $BaBi_2Nb_2O_9$, $BaBi_3Ti_2NbO_{12}$, $CaBi_2Ta_2O_9$, $SrBi_2Ta_2O_9$, $BaBi_2Ta_2O_9$, $Na_{0.5}Bi_{2.5}Ta_2O_9$, $Bi_7Ti_4NbO_{21}$ and $Bi_5Nb_3O_{15}$. The {001} plane of these compounds has good lattice matching with the pseudo-cubic {100} plane of the isotropic perovskite-type compound represented by formula (1) and therefore, a first anisotropically shaped powder comprising such a compound and using the {001} plane as the oriented plane is suitable as a reactive template for the production of a crystal-oriented ceramic with the oriented plane being a pseudo-cubic {100} plane.

A fourth example of the suitable layered perovskite-type compound constituting the anisotropically shaped powder B includes $Ca_2Nb_2O_7$ and $Sr_2Ta_2O_7$. The {010} plane of these compounds has good lattice matching with the pseudo-cubic {110} plane of the isotropic perovskite-type compound represented by formula (1) and therefore, a first anisotropically shaped powder comprising such a compound and using the {010} plane as the oriented plane is suitable as a reactive template for the production of a crystal-oriented ceramic with the oriented plane being a pseudo-cubic {110} plane.

The production method of the first anisotropically shaped powder is described below.

The first anisotropically shaped powder comprising a layered perovskite-type compound having predetermined composition, average particle diameter and/or aspect ratio (that is, the anisotropically shaped powder B) can be easily produced by using an oxide, carbonate, nitrate or the like containing the component elements for the raw material (hereinafter, referred to as an "anisotropically shaped powder-producing raw material") and heating the anisotropically shaped powder-producing raw material together with a liquid or a substance which becomes a liquid under heat.

When the anisotropically shaped powder-producing raw material is heated in a liquid phase allowing for easy diffusion of atoms, an anisotropically shaped powder B in which a plane having a small surface energy (for example, the {001} plane in the case of the compound represented by formula (3)) is preferentially grown can be easily synthesized. In this case, the average aspect ratio and average particle diameter of the anisotropically shaped powder B can be controlled by appropriately selecting the synthesis conditions.

Suitable examples of the production method for the anisotropically shaped powder B include a method of adding an appropriate flux (for example, NaCl, KCl, a mixture of NaCl and KCl, $BaCl_2$ or KF) to the anisotropically shaped powder-producing raw material and heating these at a predetermined temperature (flux method), and a method of heating an amorphous powder having the same composition as the anisotropically shaped powder B to be produced, together with an aqueous alkali solution in an autoclave (hydrothermal synthesis method).

On the other hand, the compound represented by formula (2) has a very small crystal lattice anisotropy and therefore, it is difficult to directly synthesize the first anisotropically shaped powder comprising the compound represented by formula (2) and using a specific crystal plane as the oriented plane (that is, the anisotropically shaped powder A). However, the anisotropically shaped powder A can be produced by using the anisotropically shaped powder B as a reactive template and heating this powder and the reaction raw material B (which is described later) satisfying predetermined conditions in a flux.

In the case of synthesizing the anisotropically shaped powder A by using the anisotropically shaped powder B as a reaction template, when the reaction conditions are optimized, only a change in the crystal structure takes place and a change in the powder form scarcely occurs.

In order to easily synthesize the anisotropically shaped powder A capable of being readily oriented in one direction at the forming, the anisotropically shaped powder B used for the synthesis also preferably has a shape allowing for easy orientation in one direction at the forming.

That is, also in the case of synthesizing the anisotropically shaped powder A by using the anisotropically shaped powder B as a reactive template, the average aspect ratio of the anisotropically shaped powder A is preferably at least 3 or more, more preferably 5 or more, still more preferably 10 or more. On the other hand, in order to prevent cracking in later steps, the average aspect ratio is preferably 100 or less. The average particle diameter of the anisotropically shaped powder B is preferably from 1 to 20 μm, more preferably from 1 to 13 μm, still more preferably from 2 to 8 μm.

The "reaction raw material B" means a material reacting with the anisotropically shaped powder B to produce an anisotropically shaped powder A comprising at least the compound represented by formula (4). In this case, the reaction raw material B may be a material producing only the compound represented by formula (2) by the reaction with the anisotropically shaped power B or may be a material producing both the compound represented by formula (2) and a surplus component. The "surplus component" as used herein means a substance except for the objective compound represented by formula (2). In the case where a surplus component is produced from the anisotropically shaped powder B and the reaction raw material B, the surplus component preferably comprises a material easy to thermally or chemically remove.

As for the form of the reaction raw material B, for example, an oxide powder, a composite oxide powder, a salt such as carbonate, nitrate and oxalate, and an alkoxide can be used. Also, the composition of the reaction raw material B can be determined according to the composition of the compound represented by formula (2) to be produced and the composition of the anisotropically shaped powder B.

For example, in the case of synthesizing an anisotropically shaped powder A comprising NN which is a kind of the compound represented by formula (2), by using an anisotropically shaped powder B comprising $Bi_{2.5}Na_{0.5}Nb_2O_9$ (hereinafter, referred to as "BINN2") which is a kind of the bismuth layered perovskite-type compound represented by formula (3), an Na-containing compound (e.g., oxide, hydroxide, carbonate, nitrate) can be used as the reaction raw material B. In this case, an Na-containing compound corresponding to 1.5 mol of Na atom based on 1 mol of BINN2 may be added as the reaction raw material B.

When from 1 to 500 wt % of an appropriate flux (for example, NaCl, KCl, a mixture of NaCl and KCl, $BaCl_2$ or KF) is added to the anisotropically shaped powder B and the second reaction material B each having the composition described above and heated to an eutectic point•melting point, NN and a surplus component mainly comprising $Bi_2O_3$ are produced. $Bi_2O_3$ has a low melting point and is weak against an acid and therefore, when the obtained reaction product is, after removing the flux therefrom by hot water washing or the like, heated at a high temperature or washed with an acid, an anisotropically shaped powder A comprising NN with the oriented plane being a {100} plane can be obtained.

Furthermore, for example, in the case of synthesizing an anisotropically shaped powder A comprising $(K_{0.5}Na_{0.5})NbO_3$ (hereinafter, referred to as "KNN") which is a kind of the compound represented by formula (2), by using the anisotropically shaped powder B comprising BINN2, an Na-containing compound (e.g., oxide, hydroxide, carbonate, nitrate) and a K-containing compound (e.g., oxide, hydroxide, carbonate, nitrate), or a compound containing both Na and K, may be used as the reaction raw material B. In this case, an Na-containing compound corresponding to 0.5 mol of Na atom and a K-containing compound corresponding to 1 mol of K atom based on 1 mol of BINN2 may be added as the reaction raw material B.

When from 1 to 500 wt % of an appropriate flux is added to the anisotropically shaped powder B and the reaction raw material B each having the composition described above and heated to an eutectic point•melting point, KNN and a surplus component mainly comprising $Bi_2O_3$ are produced and therefore, an anisotropically shaped powder A comprising KNN with the oriented plane being a {100} can be obtained by removing the flux and $Bi_2O_3$ from the obtained reaction product.

The same applies to the case of producing only the compound represented by formula (2) through a reaction of the anisotropically shaped powder B with the reaction raw material B, and the anisotropically shaped powder B having a predetermined composition and the reaction raw material B having a predetermined composition may be heated in an appropriate flux, whereby a compound represented by formula (2) having the objective composition can be produced in the flux. When the flux is removed from the obtained reaction product, an anisotropically shaped powder A comprising the compound represented by formula (4) with the oriented plane being a specific plane can be obtained.

The compound represented by formula (2) has a small crystal lattice anisotropy and therefore, it is difficult to directly produce an anisotropically shaped powder A and it is also difficult to directly produce an anisotropically shaped powder A with the oriented plane being an arbitrary crystal plane.

On the other hand, the layered perovskite-type compound has a large crystal lattice-anisotropy and therefore, an anisotropically shaped powder can be directly synthesized with ease. Also, in many cases, the oriented plane of an anisotropically shaped powder comprising a layered perovskite-type compound has lattice matching with a specific crystal plane of the compound represented by formula (2). Furthermore, the compound represented by formula (2) is thermodynamically stable as compared with the layered perovskite-type compound.

Therefore, when the anisotropically shaped powder B comprising a layered perovskite-type compound, in which the oriented plane has lattice matching with a specific crystal plane of the compound represented by formula (2), is reacted with the reaction raw material B in an appropriate flux, the anisotropically shaped powder B can function as a reactive template, as a result, an anisotropically shaped powder A comprising the compound represented by formula (2) and taking the orientation direction of the anisotropically shaped powder B can be easily synthesized.

In addition, when the compositions of the anisotropically shaped powder B and the reaction raw material B are optimized, the A-site element contained in the anisotropically shaped powder B (hereinafter, this element is referred to as a "surplus A-site element") is discharged as a surplus component and at the same time, an anisotropically shaped powder A comprising the compound represented by formula (2), and not containing a surplus A-site element, is produced.

Particularly, in the case where the anisotropically shaped powder B comprises a bismuth layered perovskite-type compound represented by formula (3), Bi is discharged as a surplus A-site element and a surplus component mainly comprising $Bi_2O_3$ is produced. Therefore, when this surplus component is thermally or chemically removed, an anisotropically shaped powder A containing substantially no Bi, comprising the compound represented by formula (2) and using a specific crystal plane as the oriented plane can be obtained.

In the case where, for example, a powder having the same composition as the ceramic of the objective polycrystalline ceramic body, such as isotropic perovskite-type compound represented by formula (2), is used as the coarse particle ceramic powder, a powder having the same composition as the coarse particle ceramic powder, that is, the same composition as the ceramic of the objective polycrystalline ceramic body, can also be used as the fine particle powder.

As for the fine particle powder, those capable of reacting with the first anisotropically shaped powder when sintered together with the coarse particle ceramic powder, and producing a ceramic of the objective polycrystalline ceramic body, such as compound represented by formula (1), may be used.

In this case, the fine particle powder may produce only the objective ceramic such as a isotropic perovskite-type compound by the reaction with the coarse particle ceramic powder or may produce both the objective ceramic such as isotropic perovskite-type compound, and a surplus component. In the case where a surplus component is produced by the reaction of the coarse particle ceramic powder and the fine particle powder, the surplus component is preferably a substance easy to thermally or chemically remove.

In this way, the coarse particle ceramic powder and the fine particle powder differ in composition, and a chemical reaction takes place between the anisotropically shaped powder and the fine particle powder in the heat-treating step, whereby a polycrystalline ceramic body such as isotropic perovskite-type compound can be produced.

The composition of the fine particle powder can be determined according to the composition of the coarse particle ceramic powder and the composition of the isotropic perovskite-type compound it is intended to produce, such as compound represented by formula (1). Examples of the fine particle powder which can be used include an oxide powder, a composite oxide powder, a hydroxide powder, a salt such as carbonate, nitrate and oxalate, and an alkoxide.

More specifically, for example, in the case where a crystal-oriented ceramic comprising the isotropic perovskite-type compound represented by formula (1) is produced by using, as the coarse particle ceramic powder, the anisotropically shaped powder A having a KNN or NN composition, this may be attained when a mixture of compounds containing at least one element of Li, K, Na, Nb, Ta and Sb is used as the fine particle powder, and the anisotropically shaped powder A and the fine particle powder are blended to a stoichiometric ratio of allowing for production of the isotropic perovskite-type compound represented by formula (1) having an objective composition.

Furthermore, for example, in the case where a crystal-oriented ceramic comprising the isotropic perovskite-type compound represented by formula (1) is produced by using, as the coarse particle ceramic powder, the anisotropically shaped powder B having a composition represented by formula (3), this may be attained when a mixture of compounds containing at least one element of Li, K, Na, Nb, Ta and Sb is used as the fine particle powder, and the anisotropically shaped powder B and the fine particle powder are blended to a stoichiometric ratio of allowing for production of the compound represented by formula (1) having an objective composition. The same applies to the case of producing a crystal-oriented ceramic having other compositions.

In the mixing step, in addition to the coarse particle ceramic powder and the fine particle powder blended at a predetermined ratio, an amorphous fine powder comprising a compound having the same composition as the objective ceramic such as compound represented by formula (1) obtained by the sintering or reaction of the coarse particle ceramic powder and the fine particle powder (hereinafter, this amorphous fine powder is referred to as a "compound fine powder"), and/or a sintering aid such as CuO may also be added. The addition of the compound fine powder or sintering aid is advantageous in that densification of the sintered body is facilitated.

In the case of blending the compound fine powder, if the blending ratio of the compound fine powder is excessively large, the blending ratio of the coarse particle ceramic powder occupying in the entire raw material inevitably decreases and in this case, the orientation degree of the specific crystal plane A may decrease in the polycrystalline ceramic body comprising a crystal-oriented ceramic obtained by using the first anisotropically shaped powder as the coarse particle ceramic powder. Therefore, an optimum blending ratio of the compound fine powder is preferably selected in accordance with the required sintered body density and orientation degree.

Also, in producing the isotropic perovskite-type compound represented by formula (1), the blending ratio of the coarse particle ceramic powder is preferably set such that in the compound of formula (1) represented by $ABO_3$, the ratio at which the A site is occupied by one component element or a plurality of component elements in the coarse particle ceramic powder is from 0.01 to 70 at %, more preferably from 0.1 to 50 at %, still more preferably from 1 to 10 at %. The "at %" indicates the ratio expressed as a percentage of the number of atoms.

The mixing of the coarse particle ceramic powder and the first particle powder as well as the compound fine powder and the sintering aid blended as needed may be performed by a dry process or by a wet process of adding an appropriate dispersion medium such as water or alcohol. At this time, if desired, a binder and/or a plasticizer may also be further added.

The forming step is described below.

The forming step is a step of producing a shaped body by forming the raw material mixture resulting from mixing of the coarse particle ceramic powder and the fine particle powder.

Examples of the forming method for forming the raw material mixture include a doctor blade method, a press forming method, a roll-pressing method, an extrusion forming method and a centrifugal forming method.

In the case of producing a polycrystalline ceramic body comprising a crystal-oriented ceramic with a specific crystal plane A being oriented by using the first anisotropically shaped powder having the oriented plane as the coarse particle ceramic powder, this may be attained when, in the forming step, the shaped body is produced by forming the raw material mixture such that the oriented planes are aligned nearly in the same direction, as described before.

In this case, the raw material mixture may be formed to allow for plane orientation of the coarse particle ceramic powder (first anisotropically shaped powder) or axis orientation of the coarse particle ceramic powder.

Specific preferred examples of the forming method of allowing for plane orientation of the coarse particle ceramic powder include a doctor blade method, a press forming method and a roll-pressing method. Also, specific preferred examples of the forming method of allowing for axis orientation of the coarse particle ceramic powder include an extrusion forming method and a centrifugal forming method.

In order to increase the thickness or elevate the orientation degree of the shaped body in which the coarse particle ceramic powder is plane-oriented (hereinafter, referred to as a "plane-oriented shaped body"), the plane-oriented shaped body may be further subjected to a treatment such as lamination compression, pressing or roll-pressing (hereinafter, referred to as a "plane orientation treatment").

In this case, any one plane-orientation treatment may be applied to the plane-oriented shaped body, but two or more plane-orientation treatments may also be applied. Furthermore, one plane-orientation treatment may be repeatedly applied to the plane-oriented shaped body, or two or more plane-orientation treatments may be individually repeated multiple times.

The heat-treating step is described below.

The heat-treating step is a step of heating the shaped body, thereby shrinking the shaped body and at the same time, sintering the coarse particle ceramic powder and fine particle powder to produce the polycrystalline ceramic body.

In the heat-treating step, the shaped body is heated, as a result, sintering proceeds, whereby a polycrystalline ceramic body comprising, as the main phase, a desired ceramic such as isotropic perovskite-type compound, for example, can be produced. At this time, by sintering or reacting and sintering the coarse particle ceramic powder and the fine particle powder, a ceramic such as compound represented by formula (3) can be produced.

In the heat-treating step, a surplus component is simultaneously produced depending on the composition of the anisotropically shaped powder and/or the fine particle powder.

As for the heating temperature in the heat-treating step, an optimum temperature may be selected, for example, according to the composition of the coarse particle ceramic powder or fine particle powder used or the composition of the crystal-oriented ceramic intended to produce, so that the reaction and/or sintering can efficiently proceed and a reaction product having the objective composition can be produced.

For example, in the case where a polycrystalline ceramic body comprising a crystal-oriented ceramic with the main phase being the compound represented by formula (1) is produced by using the anisotropically shaped powder A having a KNN composition, the heating may be performed such that the heating temperature in the heat-treating step, that is, the temperature T1 (° C.) in the first holding process, is in the range of $1,000 \leq T1 \leq 1,300$.

Within this temperature range, a more optimum heating temperature may be decided according to the composition of the compound represented by formula (1) which is an objective substance. As for the heating time, an optimum time may be selected according to the heating temperature so that a desired sintered body density can be obtained.

Furthermore, in the case where a surplus component is produced by the reaction of the coarse particle ceramic powder and the fine particle powder, the surplus component may be caused to remain as a sub-phase in the sintered body, or the surplus component may be removed from the sintered body. In the case of removing the surplus component, examples of the method therefor include, as described below, a thermal removing method and a chemical removing method.

The thermal removing method includes, for example, a method of evaporating the surplus component by heating a sintered body in which a ceramic having the desired composition such as compound represented by formula (1) and a surplus component are produced (hereinafter, referred to as an "intermediate sintered body"), at a predetermined temperature. More specifically, a method of heating the intermediate sintered body under reduced pressure or in oxygen for a long time at a temperature of causing evaporation of the surplus component is preferred.

As for the heating temperature at the time of thermally removing the surplus component, an optimum temperature may be selected according to the composition of the desired ceramic such as compound represented by formula (3) and/or the surplus component so that evaporation of the surplus component can efficiently proceed and production of a by-product can be suppressed.

On the other hand, examples of the method of chemically removing the surplus component include a method of dipping the intermediate sintered body in a treating solution having a property of eroding only the surplus component, and leaching the surplus component. As for the treating solution used here, an optimal treating solution may be selected according to the composition of the desired ceramic such as compound represented by formula (3) and/or the surplus component. For example, in the case where the surplus component is a bismuth oxide single phase, an acid such as nitric acid or hydrochloric acid can be used as the treating solution. Particularly, nitric acid is suitable as the treating solution for chemically extracting the surplus component mainly comprising bismuth oxide.

The reaction of the coarse particle ceramic powder with the fine particle powder and the removal of the surplus component may be performed at any timing, that is, simultaneously, sequentially or individually. For example, the removal of surplus component may be performed simultaneously with the reaction by placing the shaped body under reduced pressure or in vacuum and directly heating it to a temperature at which both the reaction of the coarse particle ceramic powder with the fine particle powder and the evaporation of the surplus component proceed efficiently.

The surplus component may also be removed, for example, by heating the shaped body in air or in oxygen at a temperature allowing for efficient proceeding of the reaction of the coarse particle ceramic powder with the fine particle powder to produce an intermediate sintered body, and subsequently heating the intermediate sintered body under reduced pressure or in vacuum at a temperature allowing for efficient proceeding of the evaporation of the surplus component, or by producing the intermediate sintered body, and subsequently heating the intermediate sintered body in air or in oxygen for a long time at a temperature allowing for efficient proceeding of the evaporation of the surplus component.

Such removal of the surplus component by heating can also be performed, for example, in the first holding process, the second holding process or the cooling process.

Furthermore, the surplus component may be chemically removed, for example, by producing the intermediate sintered body, cooling the sintered body to room temperature, and dipping the intermediate sintered body in a treating solution, or the surplus component may be thermally removed by producing the intermediate sintered body, cooling it to room temperature, and again heating the intermediate sintered body in a predetermined atmosphere at a predetermined temperature.

In the case where the shaped body obtained in the forming step contains a binder, a heat treatment mainly for the degreasing purpose may be performed before the heat-treating step. In this case, the degreasing temperature may be set to a temperature high enough to thermally decompose at least the binder.

When the shaped body is degreased, the orientation degree of the coarse particle ceramic powder in the shaped body may decrease, or cubical expansion of the shaped body may occur. In such a case, a cold isostatic pressing (CIP) treatment is preferably applied to the degreased shaped body before performing the heat-treating step. This treatment can prevent a decrease in the orientation degree resulting from degreasing or a decrease in the sintered body density ascribable to cubical expansion of the shaped body.

In the case where a surplus component is produced by the reaction of the coarse particle ceramic powder with the fine particle powder and the surplus component is removed, the intermediate sintered body from which the surplus component is removed may be subjected to a cold isostatic pressing treatment and then again fired. Also, for more elevating the sintered body density and the orientation degree, the sintered body after the heat-treating step may be further subjected to hot pressing. In addition, the method of adding the compound fine compound, the CIP treatment, the hot pressing and the like may be used in combination.

In the production method of the present invention, as described above, it is also possible to synthesize the anisotropically shaped powder A comprising the compound represented by formula (4) by using, as a reactive template, the anisotropically shaped powder B comprising a layered perovskite-type compound allowing for easy synthesis and then produce a polycrystalline ceramic body comprising the crystal-oriented ceramic by using the anisotropically shaped powder A as a reactive template. In this case, even in the case of a polycrystalline ceramic body comprising a compound represented by formula (1) or the like having a small crystal lattice anisotropy, a polycrystalline ceramic body in which an arbitrary crystal plane is oriented can be easily produced at a low cost.

Moreover, when the compositions of the anisotropically shaped powder B and the reaction raw material B are optimized, even an anisotropically shaped powder A not containing a surplus A-site element can be synthesized. Therefore, the composition of the A-site element can be easily controlled and a polycrystalline ceramic body comprising a crystal-oriented ceramic in which the main phase is a compound represented by formula (1) having a composition unobtainable by a conventional method, can be produced.

Also, the above-described anisotropically shaped powder B comprising a layered perovskite-type compound can be used as the coarse particle ceramic powder. In this case, a crystal-oriented ceramic comprising a compound represented by formula (1) or the like can be synthesized simultaneously, by sintering, in the heat-treating step. Furthermore, when the composition of the anisotropically shaped powder B to be oriented in the shaped body and the composition of the fine particle powder to be reacted therewith are optimized, not only the objective ceramic such as compound represented by formula (1) can be synthesized but also the surplus A-site element can be discharged as a surplus component from the anisotropically shaped powder B.

In addition, when the anisotropically shaped powder B of producing a surplus component, which is easy to thermally or chemically remove, is used as the coarse particle ceramic powder, a crystal-oriented ceramic containing substantially no surplus A-site element and comprising a compound represented by formula (1) or the like, with a specific crystal plane being oriented, can be obtained.

In the present invention, as described above, a polycrystalline ceramic body comprising, for example, an isotropic perovskite-type compound as the main phase can be produced. Examples of the isotropic perovskite-type compound constituting the polycrystalline ceramic body include a compound having a fundamental composition of potassium sodium niobate $(K_{1-y}Na_y)NbO_3$, in which a part of the A-site elements (K and Na) is replaced by a predetermined amount of Li and/or a part of the B-site element (Nb) is replaced by a predetermined amount of Ta and/or Sb.

The polycrystalline ceramic body preferably comprises, as the main phase, an isotropic perovskite-type compound represented by formula (1): $\{Li_x(K_{1-y}Na_y)_{1-x}\}(Nb_{1-z-w}Ta_zSb_w)O_3$ (wherein $0 \leq x \leq 0.2$, $0 \leq y \leq 1$, $0 \leq z \leq 0.4$, $0 \leq w \leq 0.2$ and $x+z+w>0$) (claim 14).

In this case, the piezoelectric properties, dielectric properties and temperature properties of the polycrystalline ceramic body can be more enhanced.

In formula (1), "$x+z+w>0$" means that it is sufficient if at least one element of Li, Ta and Sb is contained as the replacement element.

In formula (1), "y" represents the ratio of K and Na contained in the isotropic perovskite-type compound. In the isotropic perovskite-type compound, it may suffice if at least either K or Na is contained as the A-site element.

In formula (1), the range of y is preferably $0<y\leq 1$.

In this case, Na is an essential component in the compound represented by formula (1). Accordingly, the piezoelectric $g_{31}$ constant of the polycrystalline ceramic body can be more enhanced.

Also, the range of y in formula (1) may be $0\leq y<1$.

In this case, K is an essential component in the compound represented by formula (1). Accordingly, the piezoelectric properties such as piezoelectric $d_{31}$ constant of the polycrystalline ceramic body can be more enhanced. In addition, the shaped body can be sintered at a lower temperature as the amount of K added increases, so that the polycrystalline body can be produced in an energy-saving manner at a low cost.

In formula (1), y is more preferably $0.05 \leq y \leq 0.75$, still more preferably $0.20 \leq y \leq 0.70$. In these cases, the piezoelectric $d_{31}$ constant and the electromechanical coupling factor Kp of the crystal-oriented ceramic can be more enhanced. Furthermore, $0.20 \leq y < 0.70$ is preferred, $0.35 \leq y \leq 0.65$ is more preferred, $0.35 \leq y < 0.65$ is still more preferred, and $0.42 \leq y \leq 0.60$ is most preferred.

"x" represents the replacement amount of Li replacing K and/or Na which are an A-site element. When a part of K and/or Na is replaced by Li, this provides effects such as enhancement of piezoelectric properties and the like, elevation of the Curie temperature, and/or acceleration of densification.

In formula (1), the range of x is preferably $0<x\leq 0.2$.

In this case, Li is an essential component in the compound represented by formula (1). Accordingly, not only firing at the production of the polycrystalline ceramic body can be more facilitated but also the piezoelectric properties are more enhanced and the Curie temperature (Tc) can be more elevated. This is because when Li is contained as an essential component within the above-described range of x, the firing temperature decreases and at the same time, Li serves as a firing aid to enable firing with less vacancies.

If the x value exceeds 0.2, the piezoelectric properties (e.g., piezoelectric $d_{31}$ constant, electromechanical coupling factor Kp, piezoelectric $g_{31}$ constant) may deteriorate.

Also, the x value in formula (1) may be $x=0$.

In this case, formula (1) is represented by $(K_{1-y}Na_y)(Nb_{1-z-w}Ta_zSb_w)O_3$ and, as a compound comprising most lightweight Li, like $LiCO_3$, is not contained in the raw materials at the production of the polycrystalline ceramic body, the fluctuation of properties due to segregation of the raw material powder can be decreased at the time of producing the crystaloriented ceramic by mixing the raw materials. Furthermore, in this case, a high dielectric constant and a relatively large piezoelectric g constant can be realized.

In formula (1), the x value is more preferably $0 \leq x \leq 0.15$, still more preferably $0 \leq x \leq 0.10$.

"z" represents the replacement amount of Ta replacing Nb which is a B-site element. When a part of Nb is replaced by Ta, this provides an effect such as enhancement of piezoelectric properties and the like. In formula (3), if the z value exceeds 0.4, the Curie temperature decreases and utilization as a piezoelectric material for home appliances or automobiles may become difficult.

The range of z in formula (1) is preferably $0<z\leq 0.4$.

In this case, Ta is an essential component in the compound represented by formula (1). Accordingly, the sintering temperature becomes lower and at the same time, Ta serves as a sintering aid, so that vacancies in the polycrystalline ceramic body can be decreased.

Also, the z value in formula (1) may be $z=0$.

In this case, formula (1) is represented by $\{Li_x(K_{1-y}Na_y)_{1-x}\}(Nb_{1-w}Sb_w)O_3$ and since Ta is not contained in the compound represented by formula (1), the polycrystalline ceramic body can exhibit excellent piezoelectric properties without using an expensive Ta component in the production thereof.

In formula (1), the z value is more preferably $0 \leq z \leq 0.35$, still more preferably $0 \leq z \leq 0.30$.

"w" represents the replacement amount of Sb replacing Nb which is a B-site element. When a part of Nb is replaced by Sb, this provides an effect such as enhancement of piezoelectric properties and the like. If the w value exceeds 0.2, the piezoelectric properties and/or the Curie temperature decrease and this is not preferred.

In formula (1), the w value is preferably $0<w\leq0.2$.

In this case; Sb is an essential component in the compound represented by formula (1) and therefore, not only the sintering temperature of the polycrystalline ceramic body lowers and sinterability can be enhanced but also stability of the dielectric loss tan δ can be enhanced.

Also, the w value in formula (1) may be w=0.

In this case, formula (1) is represented by $\{Li_x(K_{1-y}Na_y)_{1-x}\}(Nb_{1-z}Ta_z)O_3$ and since Sb is not contained in the compound represented by formula (1), the polycrystalline ceramic body can exhibit a relatively high Curie temperature.

In formula (1), the w value is more preferably $0\leq w\leq 0.15$, still more preferably $0\leq w\leq 0.10$.

The polycrystalline ceramic body preferably comprises only an isotropic perovskite-type compound represented by formula (1), but as long as the isotropic perovskite-type crystal structure can be maintained and various properties such as sintering properties and piezoelectric properties are not adversely affected, other elements or other phases may be contained.

The polycrystalline ceramic body preferably contains from 0.0001 to 0.15 mol of one or more additional elements selected from metal elements, semimetal elements, transition metal elements, noble metal elements and alkaline earth metal elements belonging to Groups 2 to 15 of the Periodic Table, per mol of the isotropic perovskite-type compound represented by formula (1) (claim 15).

In this case, the polycrystalline ceramic body can be more enhanced in the piezoelectric properties (e.g., piezoelectric $d_{31}$ constant, electromechanical coupling factor Kp, piezoelectric $g_{31}$ constant), relative dielectric constant, dielectric loss and the like. In the polycrystalline ceramic body, the additional element may be added by replacement to the compound represented by formula (1) or may be externally added and present in the particle or at the grain boundary of the compound represented by formula (1). Also, the additional element may be incorporated as an additional simple element or as an oxide or compound containing the additional element.

If the additional element content is less than 0.0001, the effect of enhancing the piezoelectric properties by the additional element may not be satisfactorily obtained, whereas if it exceeds 0.15 mol, the piezoelectric properties or dielectric properties of the polycrystalline ceramic body may rather deteriorate.

Specific examples of the additional element include Mg, Ca, Sr, Ba, Sc, Ti, V, Cr, Mn, Fe, Co, Ni, Cu, Zn, Y, Zr, Mo, Hf, W, Re, Pd, Ag, Ru, Rh, Pt, Au, Ir, Os, B, Al, Ga, In, Si, Ge, Sn and Bi.

The additional element is preferably added at a ratio of 0.01 to 15 at % by replacing one or more element selected from Li, K, Na, Nb, Ta and Sb in the compound represented by formula (1): $\{Li_x(K_{1-y}Na_y)_{1-x}\}(Nb_{1-z-w}Ta_zSb_w)O_3$ (wherein $0\leq x\leq 0.2$, $0\leq y\leq 1$, $0\leq z\leq 0.4$, $0\leq w\leq 0.2$ and x+z+w>0).

In this case, the polycrystalline ceramic body can be more enhanced in piezoelectric properties (e.g., piezoelectric $d_{31}$ constant, electromechanical coupling factor Kp) and dielectric properties (e.g., relative dielectric constant $\epsilon_{33T}/\epsilon_0$).

If the ratio of the additional element added by replacement is less than 0.01 at %, the effect of enhancing the piezoelectric properties or dielectric properties of the polycrystalline ceramic body may not be satisfactorily obtained, whereas if it exceeds 15 at %, the piezoelectric properties or dielectric properties of the polycrystalline ceramic body may rather deteriorate. The ratio of the additional element added by replacement is preferably from 0.01 to 5 at %, more preferably from 0.01 to 2 at %, further more preferably from 0.05 to 2 at %.

The "at %" indicates the ratio expressed as a percentage of the number of atoms replaced to the number of atoms of Li, K, Na, Nb, Ta and Sb in the compound represented by formula (1).

EXAMPLES

Example 1

Examples of the present invention are described below.

This Example is a case of producing a polycrystalline ceramic body.

In the production method of a polycrystalline ceramic body of this Example, a preparation step, a mixing step, a forming step and a heat-treating step are performed.

In the preparation step, a coarse particle ceramic powder having an average particle diameter of 1 to 20 μm, and a fine particle powder having an average particle diameter of ⅓ or less of the average particle diameter of the coarse particle diameter and producing a polycrystalline ceramic body when sintered with the coarse particle ceramic powder, are prepared.

In the mixing step, the coarse particle ceramic powder and the fine particle powder are mixed to produce a raw material mixture. In the forming step, the raw material mixture is formed to produce a powder compact. In the heat-treating step, the powder compact is heated, thereby shrinking the powder compact and, at the same time, sintering the coarse particle ceramic powder and fine particle powder to produce a polycrystalline ceramic body.

In the heat-treating step, a temperature elevating process and a first holding process are performed and, furthermore, a second holding process and/or a cooling process are performed.

In the temperature elevating process, heating of the powder compact is started to elevate the temperature. In the first holding process, the powder compact is held at a temperature T1° C. (provided that $600\leq T1\leq 1,500$) for 0.1 minute or more.

Also, in the second holding process, the powder compact is held at a temperature T2° C. (provided that $T2\geq 300$) lower than the temperature T1° C. for 10 minutes or more. In the cooling process, the powder compact is cooled at a temperature dropping rate of 60° C./h or less from the temperature T1° C.

In this Example, the polycrystalline ceramic body produced is a polycrystalline ceramic body comprising a crystal-oriented ceramic in which a specific plane of the crystal grain constituting the polycrystalline ceramic body is oriented. Particularly, the polycrystalline ceramic body produced in this Example comprises a crystal-oriented ceramic in which the main phase is an isotropic perovskite-type compound represented by formula (1): $\{Li_x(K_{1-y}Na_y)_{1-x}\}(Nb_{1-z-w}Ta_zSb_w)O_3$ (wherein $0\leq x\leq 0.2$, $0\leq y\leq 1$, $0\leq z\leq 0.4$, $0\leq w\leq 0.2$ and x+z+w>0).

In this Example, a plurality of polycrystalline bodies comprising the crystal-oriented ceramic represented by formula (1) and differing in the composition or production conditions are produced.

The production method of the polycrystalline ceramic body of this Example is described in detail below.

In this Example, a polycrystalline ceramic body in which the main phase of the crystal-oriented ceramic is an isotropic perovskite-type compound having a composition of formula (1) where x=0.08, y=0.5, z=0.1 and w=0.06, namely, an isotropic perovskite-type compound represented by $\{Li_{0.08}(K_{0.5}Na_{0.5})_{0.92}\}(Nb_{0.84}Ta_{0.1}Sb_{0.06})O_3$, is produced.

(1) Production of Coarse Particle Ceramic Powder

First, as the coarse particle ceramic powder, a first anisotropically shaped powder comprising a first oriented particle having an oriented plane formed by orientation of a specific crystal plane, the oriented plane having lattice matching with a specific crystal plane A constituting the objective polycrystalline ceramic body, is produced as follows. More specifically, in this Example, an anisotropically shaped powder B comprising $Bi_{2.5}Na_{3.5}Nb_5O_{18}$ is produced and, by using this anisotropically shaped powder B, a plate-like first anisotropically shaped powder (anisotropically shaped powder A) comprising $NaNbO_3$ is produced.

That is, a $Bi_2O_3$ powder, an $Na_2CO_3$ powder and an $Nb_2O_5$ powder were weighted to a stoichiometric ratio to give a composition of $Bi_{2.5}Na_{3.5}Nb_5O_{18}$ (hereinafter, sometimes referred to as "BINN5"), and these powders were wet-mixed. Subsequently, 50 wt % of NaCl was added thereto as a flux, and the resulting raw material was dry-mixed for 1 hour.

The obtained mixture was charged into a platinum crucible, heated under the conditions of 850° C.×1 hour and after completely melting the flux, further heated under the conditions of 1,100° C.×2 hours, thereby synthesizing BINN5. Here, the temperature elevating rate was 200° C./h and the temperature dropping was performed by furnace cooling. After cooling, the flux was removed from the reaction product by hot water washing to obtain a BINN5 powder. The obtained BINN5 powder was a plate-like powder with the oriented plane being a {001} plane.

Thereafter, an $Na_2CO_3$ powder (reaction raw material) in an amount necessary for the synthesis of $NaNbO_3$ (hereinafter sometimes referred to as "NN") was added to the plate-like powder comprising BINN5, and these powders were mixed and then heat-treated at a temperature of 950° C. for 8 hours in a platinum crucible by using NaCl as a flux.

In the obtained reaction product, $Bi_2O_3$ was contained in addition to the $NaNbO_3$ powder. Therefore, the reaction product after removing the flux therefrom was dipped in an aqueous $HNO_3$ solution to dissolve $Bi_2O_3$ produced as a surplus component. Furthermore, the NN powder was separated by filtering the resulting solution and then washed with ion-exchanged water at 80° C. In this way, an NN powder (anisotropically shaped powder A) as the coarse particle ceramic powder was obtained. This is designated as Powder Sample A1.

The obtained $NaNbO_3$ powder was a plate-like powder having an average particle diameter of 15 μm and an aspect ratio of approximately from 10 to 20, with the oriented plane being a pseudo-cubic {100} plane.

(2) Production of Fine Particle Powder

Next, a fine particle powder having an average particle diameter of ⅓ or less of the average particle diameter of the coarse particle diameter and producing a polycrystalline ceramic body when sintered with the coarse particle ceramic powder, is prepared as follows.

In this Example, the NN powder is blended so that, as described later, 5 at % of the A-site element in the composition $\{Li_{0.08}(K_{0.5}Na_{0.5})_{0.92}\}(Nb_{0.84}Ta_{0.1}Sb_{0.06})O_3$ of the objective ceramic represented by the formula $ABO_3$ can be supplied from the elements of the NN powder (coarse particle ceramic powder).

In the production of the fine particle powder, an $Na_2CO_3$ powder, a $K_2CO_3$ powder, an $Li_2CO_3$ powder, an $Nb_2O_5$ powder, a $Ta_2O_5$ powder and an $Sb_2O_5$ powder each having a purity of 99.99% or more were blended to give a composition resulting from subtracting the blending portion of the NN powder from the objective ceramic composition $\{Li_{0.08}(K_{0.5}Na_{0.5})_{0.92}\}(Nb_{0.84}Ta_{0.1}Sb_{0.06})O_3$, and these powders were wet-mixed for 20 hours by using an organic solvent as the medium and using $ZrO_2$ balls.

The resulting mixed powder was then temporarily fired at a temperature of 750° C. for 5 hours and further wet-ground for 20 hours, by using an organic solvent as the medium and using $ZrO_2$ balls, whereby a temporarily fired powder (fine particle powder) having an average particle diameter of about 0.5 μm was obtained. This is designated as Powder Sample B1.

(3) Production of Powder Compact

Then, by using the coarse particle ceramic powder (Powder Sample A1) and the fine particle powder (Powder Sample B1) produced above, a polycrystalline ceramic body comprising a crystal-oriented ceramic in which the main phase is an isotropic perovskite-type compound represented by $\{Li_{0.08}(K_{0.5}Na_{0.5})_{0.92}\}(Nb_{0.84}Ta_{0.1}Sb_{0.06})O_3$ is produced.

That is, Powder Sample A1 and Powder Sample B1 were weighed to a stoichiometric ratio of giving the objective composition $\{Li_{0.08}(K_{0.5}Na_{0.5})_{0.92}\}(Nb_{0.84}Ta_{0.1}Sb_{0.06})O_3$, and wet-mixed for 20 hours, by using an organic solvent as the medium and using $ZrO_2$ balls, to obtain a slurry of the raw material mixture.

To this slurry, polyvinylbutyral resin (PVB) as a binder and dibutyl phthalate as a plasticizer were added each in an amount of about 10.35 g per mol of the objective composition ($\{Li_{0.08}(K_{0.5}Na_{0.5})_{0.92}\}(Nb_{0.84}Ta_{0.1}Sb_{0.06})O_3$) followed by mixing for 2 hours.

The raw material mixture slurry after mixing the binder and the plasticizer was formed into a tape with a thickness of about 100 μm by using a doctor blade device, and these tapes were stacked, press-bonded and roll-pressed to obtain a 1.5 mm-thick plate-like powder compact. The obtained plate-like powder compact was then degreased. The degreasing was performed in air under the conditions that the heating temperature was 600° C., the heating time was 5 hours, the temperature elevating rate was 50° C./h, and the cooling rate was furnace cooling. Furthermore, the plate-like powder compact after degreasing was subjected to a CIP treatment at a pressure of 300 MPa. The thus-obtained powder compact is designated as Formed Sample D1.

(4) Firing

Then, a polycrystalline ceramic body is produced by firing the powder compact (Formed Sample D1) obtained above. In firing Formed Sample D1, a temperature elevating process, a first holding process and a cooling process were performed.

That is, after placing Formed Sample D1 in a heating furnace, the temperature was elevated to a temperature of 1,100° C. at a temperature elevating rate of 200° C./h (temperature elevating process), and the sample was held at a temperature of 1,100° C. for 1 hour (first holding process) and then cooled to 1,000° C. at a temperature dropping rate of 5° C./h (cooling process). Furthermore, the sample was cooled to room temperature at a temperature dropping rate of 200° C./h and then, the polycrystalline ceramic body was taken out.

In this way, a polycrystalline ceramic body comprising a crystal-oriented ceramic having a main phase of $\{Li_{0.08}(K_{0.5}Na_{0.5})_{0.92}\}(Nb_{0.84}Ta_{0.1}Sb_{0.06})O_3$ was obtained. This is designated as Sample E1.

In this Example, a plurality of polycrystalline bodies having the same composition as Sample E1 were produced in the same manner as in the production of Sample E1 except for changing the firing conditions from those for Sample E1. These samples are designated as Sample E2 to Sample E4. More specifically, Samples E2 to E4 were produced by preparing the above Formed Sample D1 in the same manner as for Sample E1 and firing the Formed Sample D1 under the following conditions.

More specifically, in the production of Sample E2, Formed Sample D1 was placed in a heating furnace and the temperature was elevated to a temperature of 1,100° C. (temperature elevating process). At this time, the temperature was elevated to a temperature of 825° C. at a temperature elevating rate of 200° C./h, elevated to a temperature of 990° C. at a temperature elevating rate of 115° C./h, and further elevated to a temperature of 1,100° C. at a temperature elevating rate of 25° C./h. Also, in the temperature elevating process, the temperature elevating rate was controlled such that shrinkage of Formed Sample D1 took place at a linear shrinkage rate of about 0.0005%/sec or less (such that a constant-rate shrinkage factor was obtained in the temperature region allowing for sintering).

Thereafter, a first holding process and a cooling process were performed in the same manner as in the production of Sample E1, whereby a polycrystalline ceramic body (Sample E2) comprising a crystal-oriented ceramic having the same composition as in Sample E1 was produced.

In the production of Sample E3, Formed Sample D1 was placed in a heating furnace and, similarly to Sample E2, the temperature was elevated to a temperature of 825° C. at a temperature elevating rate of 200° C./h, elevated to a temperature of 990° C. at a temperature elevating rate of 115° C./h, and further elevated to a temperature of 1,100° C. at a temperature elevating rate of 25° C./h. Also, in the temperature elevating process, the temperature elevating rate was controlled such that shrinkage of Formed Sample D1 took place at a linear shrinkage rate of about 0.0005%/sec or less (such that a constant-rate shrinkage factor was obtained in the temperature region allowing for sintering). Thereafter, a first holding process was performed in the same manner as in the production of Sample E1 by holding the sample at a temperature of 1,100° C. for 1 hour and, then, the sample was cooled to a temperature of 1,000° C. at a temperature dropping rate of 10° C./h (cooling process). Furthermore, the sample was cooled to room temperature at a temperature dropping rate of 200° C./h in the same manner as Sample E1, whereby a polycrystalline ceramic body (Sample E3) comprising a crystal-oriented ceramic having the same composition as in Sample E1 was produced.

In the production of Sample E4, Formed Sample D1 was placed in a heating furnace and, similarly to Sample E2, the temperature was elevated to a temperature of 825° C. at a temperature elevating rate of 200° C./h, elevated to a temperature of 990° C. at a temperature elevating rate of 115° C./h, and further elevated to a temperature of 1,100° C. at a temperature elevating rate of 25° C./h. Also, in the temperature elevating process, the temperature elevating rate was controlled such that shrinkage of Formed Sample D1 took place at a linear shrinkage rate of about 0.0005%/sec or less (such that a constant-rate shrinkage factor was obtained in the temperature region allowing for sintering). Thereafter, a first holding process was performed in the same manner as in the production of Sample E1 by holding the sample at a temperature of 1,1000° C. for 1 hour and, then, the sample was cooled to a temperature of 1,000° C. at a temperature dropping rate of 20° C./h (cooling process). Furthermore, the sample was cooled to room temperature at a temperature dropping rate of 200° C./h in the same manner as Sample E1, whereby a polycrystalline ceramic body (Sample E4) comprising a crystal-oriented ceramic having the same composition as in Sample E1 was produced.

In this Example, for the purpose of comparison with Samples E1 to E4, a polycrystalline ceramic body having the same composition as in Samples E1 to E4 was produced by using only the temporarily fired powder having an average particle diameter of about 0.5 μm. This is designated as Sample C1. Sample C1 is produced by not using the coarse particle ceramic powder employed as the template in the production of Samples E1 to E4 and is a non-oriented body.

In the production of Sample C1, an $Na_2CO_3$ powder, a $K_2CO_3$ powder, an $Li_2CO_3$ powder, an $Nb_2O_5$ powder, a $Ta_2O_5$ powder and an $Sb_2O_5$ powder each having a purity of 99.99% or more were prepared. These powders were weighed to a stoichiometric ratio giving a composition $\{Li_{0.08}(K_{0.5}Na_{0.5})_{0.92}\}(Nb_{0.84}Ta_{0.1}Sb_{0.06})O_3$, and wet-mixed for 20 hours by using an organic solvent as the medium and using $ZrO_2$ balls. The resulting mixed powder was then temporarily fired at a temperature of 750° C. for 5 hours and further wet-ground for 20 hours by using an organic solvent as the medium and using $ZrO_2$ balls, whereby a temporarily fired powder having an average particle diameter of about 0.5 μm was obtained. This is designated as Powder Sample B2.

Power Sample B2 was then wet-mixed for 20 hours by using an organic solvent as the medium and using $ZrO_2$ balls to obtain a slurry.

Thereafter, in the same manner as in the production of Sample E1, a binder and a plasticizer were added to this slurry, the slurry was formed by using a doctor blade device, and the resulting powder compacts were stacked, press-bonded and roll-pressed to obtain a 1.5 mm-thick plate-like powder compact. Furthermore, in the same manner as in the production of Sample E1, the obtained powder compact was degreased and then subjected to a CIP treatment. The thus-obtained powder compact is designated as Formed Sample D2.

Subsequently, Formed Sample D2 was placed in a heating furnace, the temperature was elevated to a temperature of 1,100° C. at a temperature elevating rate of 200° C./h, the sample was held at a temperature of 1,100° C. for 1 hour and after cooling to room temperature at a temperature dropping rate of 200° C./h, the polycrystalline ceramic body was taken out. In this way, a polycrystalline ceramic body (Sample C1) comprising a non-oriented ceramic represented by $\{Li_{0.08}(K_{0.5}Na_{0.5})_{0.92}\}(Nb_{0.84}Ta_{0.1}Sb_{0.06})O_3$ was obtained.

Also, in this Example, for the purpose of comparison with Samples E1 to E4, a polycrystalline ceramic body comprising a crystal-oriented ceramic having the same composition as in Samples E1 to E4 was produced in the same manner except for changing the firing conditions from those in the production of these samples. This is designated as Sample C2. More specifically, Sample C2 was produced by preparing Formed Sample D1 in the same manner as in the production of Sample E1, and firing Formed Sample D1 under the following conditions.

That is, in the same manner as in the production of Sample E1, Formed Sample D1 was placed in a heating furnace, the temperature was elevated to a temperature of 1,100° C. at a temperature elevating rate of 200° C./h, and the sample was held at a temperature of 1,100° C. for 1 hour. Thereafter, the sample was cooled to room temperature at a temperature dropping rate of 200° C./h and then, the polycrystalline ceramic body was taken out. In this way, a polycrystalline ceramic body (Sample C2) comprising a crystal-oriented ceramic having a main phase of $\{Li_{0.08}(K_{0.5}Na_{0.5})_{0.92}\}(Nb_{0.84}Ta_{0.1}Sb_{0.06})O_3$ was obtained.

The composition, the presence or absence of orientation, the amount of NN powder template and the firing conditions of the thus-produced Samples E1 to E4 and Samples C1 and C2 are shown in Table 1. Incidentally, in Table 1 as well as in Tables 2 and 3 set forth later, the amount of NN powder temperate indicates the amount (at %) supplied to the A-site element in the objective ceramic composition represented by the formula: $ABO_3$.

Powder Sample B3 was produced in the same manner as Powder Sample B1 of Example 1 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder were mixed to give the objective ceramic composition $\{Li_{0.04}(K_{0.46}Na_{0.54})_{0.96}\}(Nb_{0.84}Ta_{0.1}Sb_{0.06})O_3$. Powder Sample B3 is a temporarily fired powder (fine particle powder) having an average particle diameter of about 0.5 μm.

Then, similarly to Example 1, Powder Sample A2 and Powder Sample B3 were weighed to a stoichiometric ratio giving the objective composition $\{Li_{0.04}(K_{0.46}Na_{0.54})_{0.96}\}(Nb_{0.84}Ta_{0.11}Sb_{0.06})O_3$ and formed into a slurry, and the slurry was formed and degreased to produce a powder compact (a shaped body). The production, forming and degreas-

TABLE 1

| Sample No. | Composition | | | | Presence or Absence of Orientation | Amount of $NaNbO_3$ Template (at %) | Temperature Elevating Conditions | Maximum Temperature Conditions | | Temperature Dropping conditions |
|---|---|---|---|---|---|---|---|---|---|---|
| | x | y | z | w | | | | Temperature (°C.) | Time (h) | |
| Sample E1 | 0.08 | 0.50 | 0.10 | 0.06 | oriented | 5 | 200° C./h | 1100 | 1 | 5° C./h (to 1000° C.) →200° C./h (to room temperature) |
| Sample E2 | 0.08 | 0.50 | 0.10 | 0.06 | oriented | 5 | 200° C./h (to 825° C.) →115° C./h (to 990° C.) →25° C./h (to 1100° C.) | 1100 | 1 | 5° C./h (to 1000° C.) →200° C./h (to room temperature) |
| Sample E3 | 0.08 | 0.50 | 0.10 | 0.06 | oriented | 5 | 200° C./h (to 825° C.) →115° C./h (to 990° C.) →25° C./h (to 1100° C.) | 1100 | 1 | 10° C./h (to 1000° C.) →200° C./h (to room temperature) |
| Sample E4 | 0.08 | 0.50 | 0.10 | 0.06 | oriented | 5 | 200° C./h (to 825° C.) →115° C./h (to 990° C.) →25° C./h (to 1100° C.) | 1100 | 1 | 20° C./h (to 1000° C.) →200° C./h (to room temperature) |
| Sample C1 | 0.08 | 0.50 | 0.10 | 0.06 | non-oriented | 0 | 200° C./h | 1100 | 1 | 200° C./h |
| Sample C2 | 0.08 | 0.50 | 0.10 | 0.06 | oriented | 5 | 200° C./h | 1100 | 1 | 200° C./h |

Example 2

This Example is a case of producing a polycrystalline ceramic body having a composition different from that in Example 1. In this Example, a polycrystalline ceramic body (Sample E5) comprising a crystal-oriented ceramic with the main phase being an isotropic perovskite-type compound having a composition of formula (1) where x=0.04, y=0.54, z=0.1 and w=0.06, namely, an isotropic perovskite-type compound represented by $\{Li_{0.04}(K_{0.46}Na_{0.54})_{0.96}\}(Nb_{0.84}Ta_{0.1}Sb_{0.06})O_3$, is produced.

In the production of Sample E5, first, an anisotropically shaped powder B (BINN5) was produced in the same manner as in Example 1 and, then, the anisotropically shaped powder B was ground by dry-grinding.

Subsequently, using the anisotropically shaped powder after grinding, an anisotropically shaped powder A (NN powder) was produced as the coarse particle ceramic powder in the same manner as in Example 1. This is designated as Powder Sample A2.

Powder Sample A2 was a plate-like powder having an average particle diameter of 6 μm and an aspect ratio of approximately from 4 to 10, with the oriented plane being a pseudo-cubic {100} plane.

Thereafter, a fine particle powder was produced in the same manner as in Example 1. This is designated as Powder Sample B3.

ing of the slurry were performed in the same manner as in Example 1. The thus-obtained powder compact is designated as Formed Sample D3.

After placing Formed Sample D3 in a heating furnace, the temperature was elevated to a temperature of 1,125° C. at a temperature elevating rate of 200° C./h (temperature elevating process), and the sample was held at this temperature of 1,125° C. for 1 hour (first holding process) and then cooled to a temperature of 1,000° C. at a temperature dropping rate of 5° C./h (cooling process). Furthermore, the sample was cooled to room temperature at a temperature dropping rate of 200° C./h and then, the polycrystalline ceramic body was taken out.

In this way, a polycrystalline ceramic body (Sample E5) comprising a crystal-oriented ceramic having a main phase of $\{Li_{0.04}(K_{0.46}Na_{0.54})_{0.96}\}(Nb_{0.84}Ta_{0.1}Sb_{0.06})O_3$ was obtained.

In this Example, a polycrystalline ceramic body having the same composition as Sample E5 was produced in the same manner as in the production of Sample E5 except for changing the firing conditions from those for Sample E5. This is designated as Sample E6. More specifically, Sample E6 was produced by preparing Formed Sample D3 in the same manner as in the production of Sample E5, and firing Formed Sample D3 under the following conditions.

That is, Formed Sample D3 obtained was placed in a heating furnace and the temperature was elevated to a temperature of 1,125° C. At this time, the temperature was elevated to a temperature of 920° C. at a temperature elevating rate of 200° C./h, elevated to a temperature of 1,040° C. at a temperature elevating rate of 65° C./h, and further elevated to a temperature of 1,125° C. at a temperature elevating rate of 12° C./h. Also, in the temperature elevating process, the temperature elevating rate was controlled such that shrinkage of Formed Sample D3 took place at a linear shrinkage rate of about 0.0005%/sec or less (such that a constant-rate shrinkage factor was obtained in the temperature region allowing for sintering).

Thereafter, the first holding process and the cooling process were performed in the same manner as in the production of Sample E5, and then cooling to room temperature was performed, whereby a polycrystalline ceramic body (Sample E6) comprising a crystal-oriented ceramic having the same composition as in Sample E5 was produced.

Also, in this Example, for the purpose of comparison with Samples E5 and E6, a polycrystalline ceramic body having the same composition as in Samples E5 and E6 was produced by using only the temporarily fired powder having an average particle diameter of about 0.5 µm. This is designated as Sample C3. Sample C3 is produced by not using the coarse particle ceramic powder employed as the template in the production of Samples E5 and E6 and is a non-oriented body.

That is, in the production of Sample C3, a temporarily fired powder was first produced in the same manner as in the production of Sample C1 in Example 1. This is designated as Powder Sample B4. Powder Sample B4 was produced in the same manner as Powder Sample B2 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder each having a purity of 99.99% or more were mixed to a stoichiometric ratio of giving the objective ceramic composition $\{Li_{0.04}(K_{0.46}Na_{0.54})_{0.96}\}(Nb_{0.84}Ta_{0.1}Sb_{0.06})O_3$. Powder Sample B4 is a temporarily fired powder having an average particle diameter of about 0.5 µm.

Furthermore, in the same manner as in the production of Sample C1, a slurry was produced by using Powder Sample B4, a binder and a plasticizer were added to the slurry and mixed, and the slurry was formed by using a doctor blade device. The resulting powder compacts were stacked, press-bonded and roll-pressed to obtain a 1.5 mm-thick plate-like powder compact, and this powder compact was degreased and then subjected to a CIP treatment. The thus-obtained powder compact is designated as Formed Sample D4.

Subsequently, Formed Sample D4 was placed in a heating furnace, the temperature was elevated to a temperature of 1,125° C. at a temperature elevating rate of 200° C./h, the sample was held at a temperature of 1,125° C. for 1 hour and after cooling to room temperature at a temperature dropping rate of 200° C./h, the polycrystalline ceramic body was taken out. In this way, a polycrystalline ceramic body (Sample C3) comprising a non-oriented ceramic represented by $\{Li_{0.04}(K_{0.46}Na_{0.54})_{0.96}\}(Nb_{0.84}Ta_{0.1}Sb_{0.06})O_3$ was obtained.

Also, in this Example, for the purpose of comparison with Samples E5 and E6, a polycrystalline ceramic body comprising a crystal-oriented ceramic having the same composition as in Samples E5 and E6 was produced in the same manner except for changing the firing conditions from those in the production of these samples. This is designated as Sample C4. More specifically, Sample C4 was produced by preparing Formed Sample D3 in the same manner as in the production of Samples E5 and E6, and firing Formed Sample D3 under the following conditions.

That is, in the same manner as in the production of Sample E5, Formed Sample D3 was placed in a heating furnace, the temperature was elevated to a temperature of 1,125° C. at a temperature elevating rate of 200° C./h, and the sample was held at a temperature of 1,125° C. for 1 hour. Thereafter, the sample was cooled to room temperature at a temperature dropping rate of 200° C./h and then, the polycrystalline ceramic body was taken out. In this way, a polycrystalline ceramic body (Sample C4) comprising a crystal-oriented ceramic having a main phase of $\{Li_{0.04}(K_{0.46}Na_{0.54})_{0.96}\}(Nb_{0.84}Ta_{0.1}Sb_{0.06})O_3$ was obtained.

The composition, the presence or absence of orientation, the amount of NN powder template and the firing conditions of the thus-produced Samples E5 and E6 and Samples C3 and C4 are shown in Table 2 below.

Furthermore, in this Example, a polycrystalline ceramic body (Sample E7) comprising a crystal-oriented ceramic with the main phase being an isotropic perovskite-type compound having a composition of formula (1) where x=0.04, y=0.5, z=0.1 and w=0.04, namely, an isotropic perovskite-type compound represented by $\{Li_{0.04}(K_{0.5}Na_{0.5})_{0.96}\}(Nb_{0.86}Ta_{0.1}Sb_{0.04})O_3$, is produced.

In the production of Sample E7, first, a coarse particle ceramic powder (anisotropically shaped powder A; NN powder) was produced. As for this coarse particle ceramic powder, the same powder as Powder Sample A1 of Example 1 was prepared.

Subsequently, a fine particle powder was produced in the same manner as in Example 1. This is designated as Powder Sample B5.

Powder Sample B5 was produced in the same manner as Powder Sample B1 of Example 1 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder were mixed to a stoichiometric ratio giving the objective ceramic composition $\{Li_{0.04}(K_{0.5}Na_{0.5})_{0.96}\}(Nb_{0.86}Ta_{0.1}Sb_{0.04})O_3$. Powder Sample B5 is a temporarily fired powder (fine particle powder) having an average particle diameter of about 0.5 µm.

Then, similarly to Example 1, Powder Sample A1 and Powder Sample B5 were weighed to a stoichiometric ratio giving the objective composition $\{Li_{0.04}(K_{0.5}Na_{0.5})_{0.96}\}(Nb_{0.86}Ta_{0.1}Sb_{0.04})O_3$ and formed into a slurry, and the slurry was formed and degreased to produce a powder compact. The production, forming and degreasing of the slurry were performed in the same manner as in Example 1. The thus-obtained powder compact is designated as Formed Sample D5.

Subsequently, Formed Sample D5 obtained was placed in a heating furnace and the temperature was elevated to a temperature of 1,115° C. (temperature elevating process). At this time, the temperature was elevated to a temperature of 955° C. at a temperature elevating rate of 200° C./h, elevated to a temperature of 1,069° C. at a temperature elevating rate of 46° C./h, and further elevated to a temperature of 1,115° C. at a temperature elevating rate of 9° C./h. Also, in the temperature elevating process, the temperature elevating rate was controlled such that shrinkage of Formed Sample D1 took place at a linear shrinkage rate of about 0.0005%/sec or less. Furthermore, the shrinkage of the powder compact (Formed Sample D5) due to heating was caused to take place nearly at a constant linear shrinkage rate in the temperature region from a temperature 50° C. lower than the maximum temperature T1 (1,115)° C. to T1° C., in this Example, in the temperature region from a temperature of 1,069° C. to a temperature of 1,115° C. Thereafter, the sample was held at a temperature of 1,115° C. for 1 hour (first holding process) and then cooled to a temperature of 1,000° C. at a temperature dropping rate of 5° C./h (cooling process). Furthermore, the sample was cooled to room temperature at a temperature dropping rate of 200° C./h and then, the polycrystalline ceramic body was taken out.

In this way, a polycrystalline ceramic body (Sample E7) comprising a crystal-oriented ceramic having a main phase of $\{Li_{0.04}(K_{0.5}Na_{0.5})_{0.96}\}(Nb_{0.86}Ta_{0.1}Sb_{0.04})O_3$ was obtained.

In this Example, for the purpose of comparison with Sample E7, a polycrystalline ceramic body having the same composition as in Sample E7 was produced by using only the temporarily fired powder having an average particle diameter of about 0.5 μm. This is designated as Sample C5. Sample C5 is produced by not using the coarse particle ceramic powder employed as the template in the production of Sample E7 and is a non-oriented body.

That is, in the production of Sample C5, a temporarily fired powder was first produced in the same manner as in the production of Sample C1 in Example 1. This is designated as Powder Sample B6. Powder Sample B6 was produced in the same manner as Powder Sample B2 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder each having a purity of 99.99% or more were mixed to a stoichiometric ratio giving the objective ceramic composition $\{Li_{0.04}(K_{0.5}Na_{0.5})_{0.96}\}(Nb_{0.86}Ta_{0.1}Sb_{0.04})O_3$. Powder Sample B6 is a temporarily fired powder having an average particle diameter of about 0.5 μm.

Furthermore, in the same manner as in the production of Sample C1, a slurry was produced by using Powder Sample B6, a binder and a plasticizer were added to the slurry and mixed, and the slurry was formed by using a doctor blade device. The resulting powder compacts were stacked, press-bonded and roll-pressed to obtain a 1.5 mm-thick plate-like powder compact, and this powder compact was degreased and then subjected to a CIP treatment. The thus-obtained powder compact is designated as Formed Sample D6.

Subsequently, Formed Sample D6 was placed in a heating furnace, the temperature was elevated to a temperature of 1,115° C. at a temperature elevating rate of 200° C./h, the sample was held at a temperature of 1,115° C. for 1 hour and after cooling to room temperature at a temperature dropping rate of 200° C./h, the polycrystalline ceramic body was taken out. In this way, a polycrystalline ceramic body (Sample C5) comprising a non-oriented ceramic represented by $\{Li_{0.04}(K_{0.5}Na_{0.5})_{0.96}\}(Nb_{0.86}Ta_{0.1}Sb_{0.04})O_3$ was obtained.

Also, in this Example, for the purpose of comparison with Sample E7, a polycrystalline ceramic body comprising a crystal-oriented ceramic having the same composition as in Sample E7 was produced in the same manner except for changing the firing conditions from those in the production of Sample E7. This is designated as Sample C6. More specifically, Sample C6 was produced by preparing Formed Sample D5 in the same manner as in the production of Sample E7, and firing Formed Sample D5 under the following conditions.

That is, in the same manner as in the production of Sample E7, Formed Sample D5 was placed in a heating furnace, the temperature was elevated to a temperature of 1,115° C. at a temperature elevating rate of 200° C./h, and the sample was held at a temperature of 1,115° C. for 1 hour. Thereafter, the sample was cooled to room temperature at a temperature dropping rate of 200° C./h and then, the polycrystalline ceramic body was taken out. In this way, a polycrystalline ceramic body (Sample C6) comprising a crystal-oriented ceramic having a main phase of $\{Li_{0.04}(K_{0.5}Na_{0.5})_{0.96}\}(Nb_{0.86}Ta_{0.1}Sb_{0.04})O_3$ was obtained.

The composition, the presence or absence of orientation, the amount of NN powder template and the firing conditions of the thus-produced Sample E7 and Samples C6 and C6 are shown in Table 2 below.

TABLE 2

| Sample No. | Composition | | | | Presence or Absence of Orientation | Amount of $NaNbO_3$ Template (at %) | Temperature Elevating Conditions | Maximum Temperature Conditions | | Temperature Dropping conditions |
|---|---|---|---|---|---|---|---|---|---|---|
| | x | y | z | w | | | | Temperature (° C.) | Time (h) | |
| Sample E5 | 0.04 | 0.54 | 0.10 | 0.06 | oriented | 5 | 200° C./h | 1125 | 1 | 5° C./h (to 1000° C.) →200° C./h (to room temperature) |
| Sample E6 | 0.04 | 0.54 | 0.10 | 0.06 | oriented | 5 | 200° C./h (to 920° C.) →65° C./h (to 1040° C.) →12° C./h (to 1125° C.) | 1125 | 1 | 5° C./h (to 1000° C.) →200° C./h (to room temperature) |
| Sample C3 | 0.04 | 0.54 | 0.10 | 0.06 | non-oriented | 0 | 200° C./h | 1125 | 1 | 200° C./h |
| Sample C4 | 0.04 | 0.54 | 0.10 | 0.06 | oriented | 5 | 200° C./h | 1125 | 1 | 200° C./h |
| Sample E7 | 0.04 | 0.50 | 0.10 | 0.04 | oriented | 5 | 200° C./h (to 955° C.) →46° C./h (to 1069° C.) →9° C./h (to 1115° C.) | 1115 | 1 | 5° C./h (to 1000° C.) →200° C./h (to room temperature) |
| Sample C5 | 0.04 | 0.50 | 0.10 | 0.04 | non-oriented | 0 | 200° C./h | 1115 | 1 | 200° C./h |
| Sample C6 | 0.04 | 0.50 | 0.10 | 0.04 | oriented | 5 | 200° C./h | 1115 | 1 | 200° C./h |

Example 3

This Example is a case of producing a polycrystalline ceramic body having a composition different from those in Examples 1 and 2. In this Example, a polycrystalline ceramic body (Sample E8) comprising a crystal-oriented ceramic with the main phase being an isotropic perovskite-type compound having a composition of formula (1) where x=0.02, y=0.5, z=0 and w=0.06, namely, an isotropic perovskite-type compound represented by $\{Li_{0.02}(K_{0.5}Na_{0.5})_{0.98}\}(Nb_{0.94}Sb_{0.06})O_3$, is produced.

In the production of Sample E8, first, a coarse particle ceramic powder (anisotropically shaped powder A; NN powder) was produced. As for this coarse particle ceramic powder, the same powder as Powder Sample A1 of Example 1 was prepared.

Then, Powder Sample A1, an NN power, a KN powder, an LS (LiSbO$_3$) powder and an NS (NaSbO$_3$) powder were weighed to a stoichiometric ratio of giving the objective composition $\{Li_{0.02}(K_{0.5}Na_{0.5})_{0.98}\}(Nb_{0.94}Sb_{0.06})O_3$ and formed into a slurry, and the slurry was formed and degreased to produce a powder compact. The production, forming and degreasing of the slurry were performed in the same manner as in Example 1. The thus-obtained powder compact is designated as Formed Sample D7. Incidentally, those NN powder, KN powder, LS (LiSbO$_3$) powder and NS (NaSbO$_3$) powder used all had an average particle diameter of about 0.5 μm.

After placing Formed Sample D7 in a heating furnace, the temperature was elevated to a temperature of 1,125° C. at a temperature elevating rate of 200° C./h (temperature elevating process), and the sample was held at this temperature of 1,125° C. for 1 hour (first holding process), then cooled to a temperature of 1,100° C. at a temperature dropping rate of 200° C./h (cooling process) and held at a temperature of 1,100° C. for 5 hours (second holding process). Furthermore, the sample was cooled to room temperature at a temperature dropping rate of 200° C./h and then, the polycrystalline ceramic body was taken out.

In this way, a polycrystalline ceramic body (Sample E8) comprising a crystal-oriented ceramic having a main phase of $\{Li_{0.02}(K_{0.5}Na_{0.5})_{0.98}\}(Nb_{0.94}Sb_{0.06})O_3$ was obtained.

In this Example, for the purpose of comparison with Sample E8, a polycrystalline ceramic body having the same composition as in Sample E8 was produced by using only the temporarily fired powder having an average particle diameter of about 0.5 μm. This is designated as Sample C7. Sample C7 is produced by not using the coarse particle ceramic powder employed as the template in the production of Sample E8 and is a non-oriented body.

That is, in the production of Sample C7, an Na$_2$CO$_3$ powder, a K$_2$CO$_3$ powder, an Li$_2$CO$_3$ powder, an Nb$_2$O$_5$ powder, a Ta$_2$O$_5$ powder and an Sb$_2$O$_5$ powder each having a purity of 99.99% or more were prepared and these powders were mixed to a stoichiometric ratio of giving the objective ceramic composition $\{Li_{0.02}(K_{0.5}Na_{0.5})_{0.98}\}(Nb_{0.94}Sb_{0.06})O_3$. The mixing was performed by wet-mixing for 20 hours by using an organic solvent as the medium and using ZrO$_2$ balls. The resulting mixed powder was then temporarily fired at a temperature of 750° C. for 5 hours in the same manner as in Example 1, and further wet-ground for 20 hours by using an organic solvent as the medium and using ZrO$_2$ balls, whereby a temporarily fired powder (fine particle powder) having an average particle diameter of about 0.5 μm was obtained. This is designated as Powder Sample B8.

Furthermore, in the same manner as in the production of Sample C1 in Example 1, a slurry was produced by using Powder Sample B8, a binder and a plasticizer were added to the slurry and mixed, and the slurry was formed by using a doctor blade device. The resulting powder compacts were stacked, press-bonded and roll-pressed to obtain a 1.5 mm-thick plate-like powder compact, and this powder compact was degreased and then subjected to a CIP treatment. The thus-obtained powder compact is designated as Formed Sample D8.

Subsequently, Formed Sample D8 was placed in a heating furnace, the temperature was elevated to a temperature of 1,100° C. at a temperature elevating rate of 200° C./h, the sample was held at a temperature of 1,100° C. for 1 hour and after cooling to room temperature at a temperature dropping rate of 200° C./h, the polycrystalline ceramic body was taken out. In this way, a polycrystalline ceramic body (Sample C7) comprising a non-oriented ceramic represented by $\{Li_{0.02}(K_{0.5}Na_{0.5})_{0.98}\}(Nb_{0.94}Sb_{0.06})O_3$ was obtained.

Also, in this Example, for the purpose of comparison with Sample E8, two kinds of polycrystalline bodies comprising a crystal-oriented ceramic having the same composition as in Sample E8 were produced in the same manner except for changing the firing conditions from those in the production of Sample E8. These are designated as Sample C8 and Sample C9. More specifically, Samples C8 and C9 were produced by preparing Formed Sample D7 in the same manner as in the production of Sample E8, and firing Formed Sample D7 under the following conditions.

That is, in the production of Sample C8, Formed Sample D7 was prepared and then placed in a heating furnace, the temperature was elevated to a temperature of 1,100° C. at a temperature elevating rate of 200° C./h, the sample was held at a temperature of 1,100° C. for 1 hour and after cooling to room temperature at a temperature dropping rate of 200° C./h, the polycrystalline ceramic body was taken out. In this way, a polycrystalline ceramic body (Sample C8) comprising a crystal-oriented ceramic having a main phase of $\{Li_{0.02}(K_{0.5}Na_{0.5})_{0.98}\}(Nb_{0.94}Sb_{0.06})O_3$ was obtained.

Sample C9 was produced under the same firing conditions as in the production of Sample C8 except that in the production of Sample C8, the firing was performed at a maximum holding temperature of 1,125° C.

The composition, the presence or absence of orientation, the amount of NN powder template and the firing conditions of the thus-produced Sample E8 and Samples C7 to C9 are shown in Table 3 below.

Also, in this Example, a polycrystalline ceramic body having the same composition as Sample E7 in Example 2, that is, comprising a crystal-oriented ceramic with the main phase being an isotropic perovskite-type compound represented by $\{Li_{0.04}(K_{0.5}Na_{0.5})_{0.96}\}(Nb_{0.86}Ta_{0.1}Sb_{0.04})O_3$, which is a polycrystalline ceramic body where Ag$_2$O is added as an additive, is produced. This is designated as Sample E9.

In the production of Sample E9, first, a coarse particle ceramic powder (anisotropically shaped powder A; NN powder) was produced. As for this coarse particle ceramic powder, the same powder as Powder Sample A1 of Example 1 was prepared.

Also, Powder Sample B5 used in the production of Sample E7 was prepared as the fine particle powder.

Then, Powder Sample A1 and Powder Sample B5 were mixed in the same manner as in Example 1 to a stoichiometric ratio giving the objective composition $\{Li_{0.04}(K_{0.5}Na_{0.5})_{0.96}\}(Nb_{0.86}Ta_{0.1}Sb_{0.04})O_3$. Furthermore, Ag$_2$O as an additive was added such that the amount of Ag added became 1 mol % of the objective composition $\{Li_{0.04}(K_{0.5}Na_{0.5})_{0.96}\}(Nb_{0.86}Ta_{0.1}Sb_{0.04})O_3$, and mixed. Thereafter, in the same manner as in Example 1, the obtained mixed powder was formed into a slurry, and the slurry was formed and degreased to produce a powder compact. The thus-obtained powder compact is designated as Formed Sample D9.

After placing Formed Sample D9 in a heating furnace, the temperature was elevated to a temperature of 1,125° C. at a temperature elevating rate of 200° C./h (temperature elevating process), and the sample was held at this temperature of 1,125° C. for 5 hours (first holding process), then cooled to a temperature of 1,100° C. at a temperature dropping rate of 200° C./h and held at a temperature of 1,100° C. for 10 hours (second holding process). Furthermore, the sample was cooled to room temperature at a temperature dropping rate of 200° C./h and then, the polycrystalline ceramic body was taken out.

In this way, a polycrystalline ceramic body (Sample E9) comprising a crystal-oriented ceramic having a main phase of $\{Li_{0.04}(K_{0.5}Na_{0.5})_{0.96}\}(Nb_{0.86}Ta_{0.1}Sb_{0.04})O_3$, in which an additive $Ag_2O$ was added, was obtained.

In this Example, for the purpose of comparison with Sample E9, a polycrystalline ceramic body having the same composition as in Sample E9, in which an additive $Ag_2O$ was blended, was produced by using only the temporarily fired powder having an average particle diameter of about 0.5 μm. This is designated as Sample C10. Sample C10 is produced by not using the coarse particle ceramic powder employed as the template in the production of Sample E9 and is a non-oriented body.

That is, in the production of Sample C10, Powder Sample B6 as the temporarily fired powder was first prepared in the same manner as in the production of Sample C5 in Example 2. Subsequently, $Ag_2O$ as an additive was added to Power Sample B6 such that the amount of Ag added became 1 mol % of the objective composition $\{Li_{0.04}(K_{0.5}Na_{0.5})_{0.96}\}(Nb_{0.86}Ta_{0.1}Sb_{0.04})O_3$, and mixed.

Furthermore, in the same manner as in the production of Sample C1 in Example 1, a slurry was produced by using Powder Sample B6 having added thereto the additive, a binder and a plasticizer were added to the slurry and mixed, and the slurry was formed by using a doctor blade device. The resulting powder compacts were stacked, press-bonded and roll-pressed to obtain a 1.5 mm-thick plate-like powder compact, and this powder compact was degreased and then subjected to a CIP treatment. The thus-obtained powder is designated as Formed Sample D10.

Subsequently, Formed Sample D10 was placed in a heating furnace, the temperature was elevated to a temperature of 1,100° C. at a temperature elevating rate of 200° C./h, the sample was held at a temperature of 1,100° C. for 1 hour and after cooling to room temperature at a temperature dropping rate of 200° C./h, the polycrystalline ceramic body was taken out.

In this way, a polycrystalline ceramic body (Sample C10) comprising a non-oriented ceramic having a main phase of $\{Li_{0.04}(K_{0.5}Na_{0.5})_{0.96}\}(Nb_{0.86}Ta_{0.1}Sb_{0.04})O_3$, in which an additive $Ag_2O$ was added, was obtained.

Also, in this Example, for the purpose of comparison with Sample E9, two kinds of polycrystalline bodies comprising a crystal-oriented ceramic having the same composition as in Sample E9, in which an additive $Ag_2O$ was blended, were produced in the same manner except for changing the firing conditions from those in the production of Sample E9. These are designated as Sample C11 and Sample C12. More specifically, Samples C11 and C12 were produced by preparing Formed Sample D9 in the same manner as in the production of Sample E9, and firing Formed Sample D9 under the following conditions.

That is, in the production of Sample C11, Formed Sample D9 was prepared and then placed in a heating furnace, the temperature was elevated to a temperature of 1,100° C. at a temperature elevating rate of 200° C./h, the sample was held at a temperature of 1,100° C. for 1 hours and after cooling to room temperature at a temperature dropping rate of 200° C./h, the polycrystalline ceramic body was taken out. In this way, a polycrystalline ceramic body (Sample C11) comprising a crystal-oriented ceramic having a main phase of $\{Li_{0.04}(K_{0.5}Na_{0.5})_{0.96}\}(Nb_{0.86}Ta_{0.1}Sb_{0.04})O_3$, in which an additive $Ag_2O$ was added, was obtained.

Sample C12 was produced under the same firing conditions as in the production of Sample C11 except that in the production of Sample C8, the firing was performed at a maximum holding temperature of 1,135° C. and the holding time at the maximum holding temperature was 5 hours.

The composition, the presence or absence of orientation, the amount of NN powder template and the firing conditions of the thus-produced Sample E9 and Samples C10 to C12 are shown in Table 3 below.

TABLE 3

| Sample No. | Composition | | | | Additive | Presence or Absence of Orientation | Amount of $NaNbO_3$ Template (at %) | Temperature Elevating Conditions | Maximum Temperature Conditions | | Temperature Dropping conditions |
|---|---|---|---|---|---|---|---|---|---|---|---|
| | x | y | z | w | | | | | Temperature (°C.) | Time (h) | |
| Sample E8 | 0.02 | 0.50 | 0.00 | 0.06 | — | oriented | 5 | 200° C./h | 1125 | 1 | 5° C./h (to 1100° C.) →held at 1100° C. for 5 hours →200° C./h (to room temperature) |
| Sample C7 | 0.02 | 0.50 | 0.00 | 0.06 | — | non-oriented | 0 | 200° C./h | 1100 | 1 | 200° C./h |
| Sample C8 | 0.02 | 0.50 | 0.00 | 0.06 | — | oriented | 5 | 200° C./h | 1100 | 1 | 200° C./h |
| Sample C9 | 0.02 | 0.50 | 0.00 | 0.06 | — | oriented | 5 | 200° C./h | 1125 | 1 | 200° C./h |
| Sample E9 | 0.04 | 0.50 | 0.10 | 0.04 | $Ag_2O$ | oriented | 5 | 200° C./h | 1125 | 5 | 200° C./h (to 1100° C.) →held at 1100° C. for 10 hours →200° C./h (to room temperature) |
| Sample C10 | 0.04 | 0.50 | 0.10 | 0.04 | $Ag_2O$ | non-oriented | 0 | 200° C./h | 1100 | 1 | 200° C./h |
| Sample C11 | 0.04 | 0.50 | 0.10 | 0.04 | $Ag_2O$ | oriented | 5 | 200° C./h | 1100 | 1 | 200° C./h |
| Sample C12 | 0.04 | 0.50 | 0.10 | 0.04 | $Ag_2O$ | oriented | 5 | 200° C./h | 1135 | 5 | 200° C./h |

Example 4

This Example is a case of producing a polycrystalline ceramic body having a composition different from those in Examples 1 to 3, and this is a polycrystalline ceramic body in which $MnO_2$ is added as an additive. That is, in this Example, a polycrystalline ceramic body (Sample E10) comprising a crystal-oriented ceramic with the main phase being an isotropic perovskite-type compound having a composition of formula (1) where x=0.065, y=0.55, z=0.09 and w=0.08, namely, an isotropic perovskite-type compound represented by $\{Li_{0.065}(K_{0.45}Na_{0.55})_{0.935}\}(Nb_{0.83}Ta_{0.09}Sb_{0.08})O_3$, is produced.

In the production of Sample E10, first, a coarse particle ceramic powder (anisotropically shaped powder A; NN powder) was produced. As for this coarse particle ceramic powder, the same powder as Powder Sample A1 of Example 1 was prepared.

Thereafter, a fine particle powder was produced in the same manner as in Example 1. This is designated as Powder Sample B7.

Powder Sample B7 was produced in the same manner as Powder Sample B1 of Example 1 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder were mixed to give the objective ceramic composition $\{Li_{0.065}(K_{0.45}Na_{0.55})_{0.935}\}(Nb_{0.83}Ta_{0.09}Sb_{0.08})O_3$, and $MnO_2$ as an additive was added such that the amount of Mn added became 0.05 mol % of the objective ceramic composition $\{Li_{0.065}(K_{0.45}Na_{0.55})_{0.935}\}(Nb_{0.83}Ta_{0.09}Sb_{0.08})O_3$, and mixed. Powder Sample B7 is a temporarily fired powder (fine particle powder) having an average particle diameter of about 0.5 μm.

Then, similarly to Example 1, Powder Sample A1 and Powder Sample B7 were weighed to a stoichiometric ratio of giving the objective composition $\{Li_{0.065}(K_{0.45}Na_{0.55})_{0.935}\}(Nb_{0.83}Ta_{0.09}Sb_{0.08})O_3$ excluding the $MnO_2$ added portion, and formed into a slurry, and the slurry was formed and degreased to produce a powder compact. The production, forming and degreasing of the slurry were performed in the same manner as in Example 1. The thus-obtained powder compact is designated as Formed Sample D11.

After placing Formed Sample D11 in a heating furnace, the temperature was elevated to a temperature of 1,105° C. at a temperature elevating rate of 200° C./h (temperature elevating process), and the sample was held at this temperature of 1,105° C. for 5 hours (first holding process) and then cooled to a temperature of 1,000° C. at a temperature dropping rate of 5° C./h (cooling process) Furthermore, the sample was cooled to room temperature at a temperature dropping rate of 200° C./h and then, the polycrystalline ceramic body was taken out.

In this way, a polycrystalline ceramic body (Sample E10) comprising a crystal-oriented ceramic having a main phase of $\{Li_{0.065}(K_{0.45}Na_{0.55})_{0.935}\}(Nb_{0.83}Ta_{0.09}Sb_{0.08})O_3$, in which the additive ($MnO_2$) was added, was obtained.

In this Example, a polycrystalline ceramic body having the same composition as Sample E10 was produced in the same manner as in the production of Sample E10 except for changing the firing conditions from those for Sample E10. This is designated as Sample E11.

More specifically, Sample E11 was produced by preparing Formed Sample D11 in the same manner as in the production of Sample E10, and firing Formed Sample D11 under the following conditions.

That is, Formed Sample D11 was placed in a heating furnace and the temperature was elevated to a temperature of 1,105° C. At this time, the temperature was elevated to a temperature of 900° C. at a temperature elevating rate of 200° C./h, elevated to a temperature of 1,020° C. at a temperature elevating rate of 45° C./h, and further elevated to a temperature of 1,105° C. at a temperature elevating rate of 9° C./h. Also, in the temperature elevating process, the temperature elevating rate was controlled such that shrinkage of Formed Sample D11 took place at a linear shrinkage rate of about 0.0005%/sec or less (such that a constant-rate shrinkage factor was obtained in the temperature region allowing for sintering).

Thereafter, the first holding process and the cooling process were performed in the same manner as in the production of Sample E10, and then cooling to room temperature was performed, whereby a polycrystalline ceramic body (Sample E11) comprising, as the main phase, a crystal-oriented ceramic having the same composition as in Sample E10 was produced.

Also, in this Example, for the purpose of comparison with Samples E10 and E11, a polycrystalline ceramic body having the same composition as in Samples E10 and E11 was produced by using only the temporarily fired powder having an average particle diameter of about 0.5 μm. This is designated as Sample C13. Sample C13 is produced by not using the coarse particle ceramic powder employed as the template in the production of Samples E10 and E11 and is a non-oriented body.

That is, in the production of Sample C13, a temporarily fired powder was first produced in the same manner as in the production of Sample C1 in Example 1. This is designated as Powder Sample B9.

Powder Sample B9 was produced in the same manner as Powder Sample B2 of Example 1 except that an $Na_2CO_3$ powder, a $K_2CO_3$ powder, an $Li_2CO_3$ powder, an $Nb_2O_5$ powder, a $Ta_2O_5$ powder and an $Sb_2O_5$ powder each having a purity of 99.99% or more were mixed to a stoichiometric ratio of giving the objective ceramic composition $\{Li_{0.065}(K_{0.45}Na_{0.55})_{0.935}\}(Nb_{0.83}Ta_{0.09}Sb_{0.08})O_3$, and $MnO_2$ as an additive was added such that the amount of Mn added became 0.05 mol % of the objective composition $\{Li_{0.065}(K_{0.45}Na_{0.55})_{0.935}\}(Nb_{0.83}Ta_{0.09}Sb_{0.08})O_3$, and mixed. Powder Sample B9 is a temporarily fired powder having an average particle diameter of about 0.5 μm.

Furthermore, in the same manner as in the production of Sample C1 in Example 1, a slurry was produced by using Powder Sample B9, a binder and a plasticizer were added to the slurry and mixed, and the slurry was formed by using a doctor blade device. The resulting powder compacts were stacked, press-bonded and roll-pressed to obtain a 1.5 mm-thick plate-like powder compact, and this powder compact was degreased and then subjected to a CIP treatment. The thus-obtained powder compact is designated as Formed Sample D12.

Subsequently, Formed Sample D12 was placed in a heating furnace, the temperature was elevated to a temperature of 1,105° C. at a temperature elevating rate of 200° C./h, the sample was held at a temperature of 1,105° C. for 5 hours and after cooling to room temperature at a temperature dropping rate of 200° C./h, the polycrystalline ceramic body was taken out. In this way, a polycrystalline ceramic body (Sample C13) comprising a non-oriented body having added thereto the additive ($MnO_2$), with the main phase being a ceramic represented by $\{Li_{0.065}(K_{0.45}Na_{0.55})_{0.935}\}(Nb_{0.83}Ta_{0.09}Sb_{0.08})O_3$, was obtained.

Also, in this Example, for the purpose of comparison with Samples E10 and E11, a polycrystalline ceramic body comprising a crystal-oriented ceramic having the same composition as in Samples E10 and E11 was produced in the same manner except for changing the firing conditions from those in the production of these samples. This is designated as Sample C14.

More specifically, Sample C14 was produced by preparing Formed Sample D11 in the same manner as in the production of Samples E10 and E11, and firing Formed Sample D11 under the following conditions.

That is, in the same manner as in the production of Sample E10, Formed Sample D11 was placed in a heating furnace, the temperature was elevated to a temperature of 1,105° C. at a temperature elevating rate of 200° C./h, and the sample was held at a temperature of 1,105° C. for 5 hours. Thereafter, the sample was cooled to room temperature at a temperature dropping rate of 200° C./h and then, the polycrystalline ceramic body was taken out. In this way, a polycrystalline ceramic body (Sample C14) comprising a crystal-oriented ceramic having a main phase of $\{Li_{0.065}(K_{0.45}Na_{0.55})_{0.935}\}(Nb_{0.83}Ta_{0.09}Sb_{0.08})O_3$, in which the additive ($MnO_2$) was added, was obtained.

The composition, the presence or absence of orientation, the amount of NN powder template and the firing conditions of the thus-produced Samples E10 and E11 and Samples C13 and C14 are shown in Table 4 below.

The results obtained are shown in Table 5.

[Average Orientation Degree]

The average orientation degree F(100) of {100} plane according to the Lotgering's method was measured for the plane parallel to the tape plane of each sample (Sample E1 to Sample E11, Sample C1 to Sample C3, Sample C5 to Sample C10, and Sample C13). The average orientation degree F was calculated by using mathematical formula 1.

The results obtained are shown in Table 5.

[Piezoelectric Property $d_{31}$]

The piezoelectric distortion constant ($d_{31}$) which is a piezoelectric property was measured for each sample (Samples E1, E2, E5 to E9 and E11 and Samples C1, C3, C5, C7, C10 and C13).

In the measurement of piezoelectric property, a disc-like sample having a thickness of 0.4 to 0.7 mm and a diameter of 8 to 11 mm with top and bottom planes being parallel to the tape plane was produced from each sample through cutting, polishing and machining. Subsequently, an Au electrode was formed on the top and bottom planes and after applying a polarizing process in the vertical direction, the piezoelectric $d_{31}$ constant was measured at room temperature by a resonance-antiresonance method.

TABLE 4

| Sample No. | Composition | | | | Additive | Presence or Absence of Orientation | Amount of NaNbO3 Template (at %) | Temperature Elevating Conditions | Maximum Temperature Conditions | | Temperature Dropping conditions |
|---|---|---|---|---|---|---|---|---|---|---|---|
| | x | y | z | w | | | | | Temperature (° C.) | Time (h) | |
| Sample E10 | 0.065 | 0.55 | 0.09 | 0.08 | MnO2 | oriented | 5 | 200° C./h | 1105 | 5 | 5° C./h (to 1000° C.) →200° C./h (to room temperature) |
| Sample E11 | 0.065 | 0.55 | 0.09 | 0.08 | MnO2 | oriented | 5 | 200° C./h (to 900° C.) →45° C./h (to 1020° C.) →9° C./h (to 1105° C.) | 1105 | 5 | 5° C./h (to 1000° C.) →200° C./h (to room temperature) |
| Sample C13 | 0.065 | 0.55 | 0.09 | 0.08 | MnO2 | non-oriented | 0 | 200° C./h | 1105 | 5 | 200° C./h |
| Sample C14 | 0.065 | 0.55 | 0.09 | 0.08 | MnO2 | oriented | 5 | 200° C./h | 1105 | 5 | 200° C./h |

Test Example

In this Example, the properties of the polycrystalline bodies (Samples E1 to E11 and Samples C1 to C14) produced in Examples 1 to 4 are examined.

[Bulk Density]

The bulk density of each sample (Samples E1 to E11 and Samples C1 to C14) was measured as follows.

The weight at the dry time (dry weight) of each sample was measured. Then, each sample was dipped in water and after impregnating water into the open pore part of each sample, the weight (wet weight) of each sample was measured. From the difference between the wet weight and the dry weight, the volume of open pores present in each sample was calculated. Also, the volume of each sample in the portion excluding open pores was measured by the Archimedes method. Subsequently, the bulk density of each sample was calculated by dividing the dry weight of each sample by the entire volume (the total of the volume of open pores and the volume of the portion excluding open pores).

The results obtained are shown in Table 5.

TABLE 5

| Sample No. | Bulk Density (g/cm³) | Orientation Degree of (100) plane (%) | Piezoelectric Property $d_{31}$ (pm/V) |
|---|---|---|---|
| Sample E1 | 4.70 | 89 | 75 |
| Sample E2 | 4.76 | 86 | 81 |
| Sample E3 | 4.73 | 84 | |
| Sample E4 | 4.68 | 84 | |
| Sample C1 | 4.72 | 0 | 66 |
| Sample C2 | 4.55 | 87 | |
| Sample E5 | 4.70 | 73 | 135 |
| Sample E6 | 4.76 | 71 | 138 |
| Sample C3 | 4.73 | 0 | 114 |
| Sample C4 | 4.59 | | |
| Sample E7 | 4.71 | 84 | 121 |
| Sample C5 | 4.70 | 0 | 96 |
| Sample C6 | 4.48 | 85 | |
| Sample E8 | 4.51 | 82 | 99 |
| Sample C7 | 4.47 | 0 | 67 |
| Sample C8 | 4.37 | 82 | |
| Sample C9 | 4.41 | 82 | |
| Sample E9 | 4.76 | 93 | 132 |

TABLE 5-continued

| Sample No. | Bulk Density (g/cm³) | Orientation Degree of (100) plane (%) | Piezoelectric Property $d_{31}$ (pm/V) |
|---|---|---|---|
| Sample C10 | 4.74 | 0 | 113 |
| Sample C11 | 4.14 | | |
| Sample C12 | 4.6 | | |
| Sample E10 | 4.69 | 91 | |
| Sample E11 | 4.72 | 90 | 99 |
| Sample C13 | 4.72 | 0 | 84 |
| Sample C14 | 4.49 | | |

As seen from comparison between Sample C1 and Sample C2, between Sample C3 and Sample C4, between Sample C5 and Sample C6, between Sample 7 and Sample C8, between Sample C10 and Sample C11 and between Sample C13 and Sample 14 in Table 5, the density differs greatly between a non-oriented body and an oriented body with the same firing conditions, and the density of the oriented body is small as compared with the non-oriented body produced under the same firing conditions. This is considered because the oriented body is produced by using, as raw materials, a coarse particle ceramic powder and a fine particle powder differing from each other in the average particle diameter.

On the other hand, as seen from comparison, for example, between Sample E1 and Sample C2, between Sample E5 and Sample C4 and between Sample E10 and Sample C14, the density greatly increases by performing a slow cooling at a temperature dropping rate of, for example, 40° C./h or more in the cooling process.

Also, as seen from the results of Samples E2 to E4, as the temperature dropping rate is lower, the density can increase significantly.

Furthermore, as seen from comparison between Sample E1 and Sample E2, between Sample E5 and Sample E6 and between Sample E10 and Sample E11, the density of the polycrystalline ceramic body can be greatly enhanced by controlling the temperature elevating rate in the temperature elevation process, for example, such that the shrinkage of the powder compact takes place at a linear shrinkage rate of 25%/h or less.

In addition, as seen from comparison between Samples E2 to E4 and Sample C2, between Sample E6 and Sample C4, between Sample E7 and Sample C6 and between Sample E11 and Sample C14, when both the temperature elevating rate and the temperature dropping rate are controlled, the density of the crystalline ceramic body can be more enhanced.

As for the samples of which piezoelectric property is evaluated, it can be seen from Table 5 that the piezoelectric property can be more enhanced by aligning the crystal plane.

Figure 1:
FIG. 1 is a view showing the results when a polycrystalline ceramic body (Sample E7) is observed by an ultrasonic imaging apparatus in Test Example.
Figure 2:
FIG. 2 is a view showing the results when a polycrystalline ceramic body (Sample C5) is observed by an ultrasonic imaging apparatus in Test Example.
Figure 3:
FIG. 3 is a view showing the results when a polycrystalline ceramic body (Sample C6) is observed by an ultrasonic imaging apparatus in Test Example.

Also, in this Example, the state of voids inside the polycrystalline ceramic body was examined by using an ultrasonic imaging apparatus (SAT) for three kinds of polycrystalline bodies of Sample E7, Sample C5 and Sample C6. The results obtained are shown in FIGS. 1 to 3. Incidentally, the samples used for the observation by SAT each has an outer diameter of 8.5 mm.

As seen from FIGS. 2 and 3, in Sample C6 comprising a crystal-oriented ceramic produced by using a coarse particle power and a fine particle powder differing from each other in the particle diameter (FIG. 3), many voids were observed as compared with Sample C5 comprising a non-oriented body produced by using a raw material powder having a nearly uniform particle diameter (FIG. 2). On the other hand, in Sample E7 produced by controlling the temperature elevating rate and the temperature dropping rate as described above, despite a crystalline ceramic body produced by using a coarse particle ceramic powder and a fine particle powder differing in the particle diameter as in the case of Sample C3, voids were scarcely observed similarly to Sample C2.

As verified in the foregoing pages, according to the Example, the temperature control is performed as described above in the heat-treating step, whereby generation of voids in the obtained polycrystalline ceramic body can be suppressed and a polycrystalline ceramic body with a high density can be obtained.

The invention claimed is:

1. A method for producing a polycrystalline ceramic body, the polycrystalline ceramic body comprising a crystal-oriented ceramic in which a specific crystal plane A of each crystal grain is oriented, said method comprising:

a preparation step of preparing a coarse particle ceramic powder having an average particle diameter of 1 to 20 μm, and a fine particle powder having an average particle diameter of ⅓ or less of the average particle diameter of the coarse particle ceramic powder and producing the polycrystalline ceramic body when sintered with the coarse particle ceramic powder, the coarse particle ceramic powder comprising a coarse particle having an oriented plane formed by orientation of a specific crystal plane, the oriented plane in said coarse particle has lattice matching with the specific crystal plane A;

a mixing step of mixing the coarse particle ceramic powder and the fine particle powder to produce a raw material mixture, a forming step of forming the raw material mixture to produce a shaped body, said forming being performed to align the oriented planes of the coarse particles nearly in the same direction, and a heat-treating step of heating the shaped body, thereby shrinking said shaped body and, at the same time, sintering the coarse particle ceramic powder and fine particle powder to produce the polycrystalline ceramic body comprising the polycrystalline ceramic body in which the specific crystal plane A of each crystal grain is oriented, wherein in said heat-treating step, a temperature elevating process of starting heating the shaped body to elevate the temperature and a first holding process of holding the shaped body at a temperature T1° C. where $600 \leq T1 \leq 1,500$, for 0.1 minute or more are performed and at the same time, a second holding process of holding the shaped body at a temperature T2° C. where $T2 \geq 300$, lower than the temperature T1° C. for 10 minutes or more, which is a process successive to said first holding process, and/or a cooling process of cooling the shaped body at a temperature dropping rate of 60° C./h or less from the temperature T1° C., which is a process successive to the first holding process, are performed.

2. The method for producing a polycrystalline ceramic body as claimed in claim 1, wherein in the mixing step, the coarse particle ceramic powder and the fine particle powder are mixed such that the blending ratio of the coarse particle ceramic powder is from 0.01 to 70 parts by weight per 100 parts by weight of the total amount of the coarse particle ceramic powder and the fine particle powder.

3. The method for producing a polycrystalline ceramic body as claimed in claim 1, wherein the holding temperature T1 (° C.) in the first holding process is $1,000 \leq T1 \leq 1,300$.

4. The method for producing a polycrystalline ceramic body as claimed in claim 1, wherein the holding temperature T1 (° C.) in the first holding process and the holding temperature T2 (° C.) in the second holding process satisfy the relationship of $5 \leq (T1-T2) \leq 300$.

5. The method for producing a polycrystalline ceramic body as claimed in claim 1, wherein the temperature dropping rate in the cooling process is 40° C./h or less.

6. The method for producing a polycrystalline ceramic body as claimed in claim 1, wherein in the temperature elevating process, the temperature elevating rate is controlled such that the shrinkage of the shaped body due to heating takes place at a linear shrinkage rate of 25%/h or less.

7. The method for producing a polycrystalline ceramic body as claimed in claim 6, wherein in the temperature elevating process, the temperature elevating rate is controlled such that the shrinkage of the shaped body due to heating takes place nearly at a constant linear shrinkage rate in the temperature region from temperature $(T1-50)°$ C. to $T1°$ C.

8. The method for producing a polycrystalline ceramic body as claimed in claim 1, wherein the coarse particle ceramic powder has an anisotropic shape with an average aspect ratio of 3 to 100.

9. The method for producing a polycrystalline ceramic body as claimed in claim 1, wherein in the polycrystalline ceramic body, a pseudo-cubic {100}plane according to the Lotgering's method is oriented as the crystal plane A and the orientation degree thereof is 30% or more.

10. The method for producing a polycrystalline ceramic body as claimed in claim 1, wherein the oriented plane is a pseudo-cubic {100}plane.

11. The method for producing a polycrystalline ceramic body as claimed in claim 1, wherein the polycrystalline ceramic body comprises an isotropic perovskite-type compound as the main phase.

12. The method for producing a polycrystalline ceramic body as claimed in claim 1, wherein the polycrystalline ceramic body comprises, as the main phase, an isotropic perovskite-type compound represented by formula (1):

$\{Li_x(K_{1-y}Na_y)_{1-x}\}(Nb_{1-z-w}Ta_zSb_w)O_3$ wherein $0 \leq x \leq 0.2$, $0 \leq y \leq 1$, $0 \leq z \leq 0.4$, $0 \leq w \leq 0.2$ and $x+z+w>0$.

13. The method for producing a polycrystalline ceramic body as claimed in claim 12, wherein the polycrystalline ceramic body contains from 0.0001 to 0.15 mol of one or more additional element selected from metal elements, semimetal elements, transition metal elements, noble metal elements and alkaline earth metal elements belonging to Groups 2 to 15 of the Periodic Table, per mol of the isotropic perovskite-type compound represented by formula (1).

14. The method for producing a polycrystalline ceramic body as claimed in claim 13, wherein the additional element is added at a ratio of 0.01 to 15 at % by replacing one or more element selected from Li, K, Na, Nb, Ta and Sb in the isotropic perovskite-type compound represented by formula (1).

* * * * *

UNITED STATES PATENT AND TRADEMARK OFFICE
CERTIFICATE OF CORRECTION

PATENT NO.        : 7,470,390 B2
APPLICATION NO.   : 11/258356
DATED             : December 30, 2008
INVENTOR(S)       : Masaya Nakamura et al.

It is certified that error appears in the above-identified patent and that said Letters Patent is hereby corrected as shown below:

In the Drawings

Figures 1-3 appearing on Sheet 1 of 2 is replaced with the attached Figures 1-3.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO.         : 7,470,390 B2                           Page 2 of 2
APPLICATION NO.    : 11/258356
DATED              : December 30, 2008
INVENTOR(S)        : Masaya Nakamura et al.

It is certified that error appears in the above-identified patent and that said Letters Patent is hereby corrected as shown below:

In Drawings

Figures 1-3 replaced with legible drawings Figures 1-3.

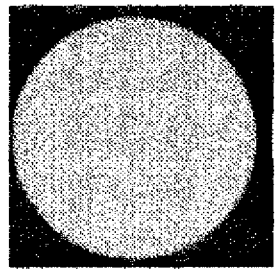

Fig.1

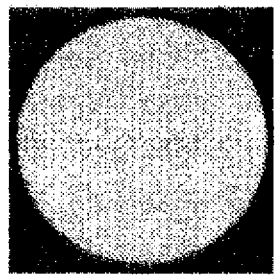

Fig.2

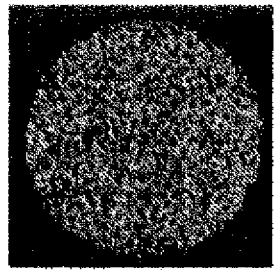

Fig.3